United States Patent
Jang et al.

(10) Patent No.: US 11,699,613 B2
(45) Date of Patent: *Jul. 11, 2023

(54) SEMICONDUCTOR DEVICES AND METHODS OF FABRICATING THE SAME

(71) Applicant: Samsung Electronics Co., Ltd., Suwon-si (KR)

(72) Inventors: Sunguk Jang, Hwaseong-si (KR); Seokhoon Kim, Suwon-si (KR); Seung Hun Lee, Hwaseong-si (KR); Yang Xu, Suwon-si (KR); Jeongho Yoo, Jeongnam-si (KR); Jongryeol Yoo, Osan-si (KR); Youngdae Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 294 days.

This patent is subject to a terminal disclaimer.

(21) Appl. No.: 17/137,485

(22) Filed: Dec. 30, 2020

(65) Prior Publication Data

US 2021/0143049 A1    May 13, 2021

Related U.S. Application Data

(63) Continuation of application No. 15/869,718, filed on Jan. 12, 2018, now Pat. No. 10,903,108.

(30) Foreign Application Priority Data

Nov. 8, 2017    (KR) .................. 10-2017-0148218

(51) Int. Cl.
*H01L 21/76*    (2006.01)
*H01L 21/762*   (2006.01)
(Continued)

(52) U.S. Cl.
CPC ...... *H01L 21/762* (2013.01); *H01L 21/02164* (2013.01); *H01L 21/02181* (2013.01);
(Continued)

(58) Field of Classification Search
CPC ............... H01L 21/762; H01L 29/165; H01L 21/02225; H01L 21/02164;
(Continued)

(56) References Cited

U.S. PATENT DOCUMENTS 6,881,987 B2    4/2005  Sohn
9,041,126 B2    5/2015  Hoffmann et al.
(Continued)

FOREIGN PATENT DOCUMENTS

CN    106653846 A    5/2017
KR    20160116423 A   10/2016
KR    20160122463 A   10/2016

*Primary Examiner* — S M Sohel Imtiaz
(74) *Attorney, Agent, or Firm* — Myers Bigel, P.A.

(57) ABSTRACT

Semiconductor devices and methods of forming the same are provided. The methods may implanting dopants into a substrate to form a preliminary impurity region and heating the substrate to convert the preliminary impurity region into an impurity region. Heating the substrate may be performed at an ambient temperature of from about 800° C. to about 950° C. for from about 20 min to about 50 min. The method may also include forming first and second trenches in the impurity region to define an active fin and forming a first isolation layer and a second isolation layer in the first and second trenches, respectively. The first and second isolation layers may expose opposing sides of the active fin. The method may further include forming a gate insulation layer extending on the opposing sides and an upper surface of the active fin and forming a gate electrode traversing the active fin.

20 Claims, 32 Drawing Sheets

(51) Int. Cl.
*H01L 21/225* (2006.01)
*H01L 29/423* (2006.01)
*H01L 21/02* (2006.01)
*H01L 29/66* (2006.01)
*H01L 29/165* (2006.01)
*H01L 29/78* (2006.01)

(52) U.S. Cl.
CPC .... *H01L 21/02225* (2013.01); *H01L 21/2253* (2013.01); *H01L 21/76229* (2013.01); *H01L 21/76232* (2013.01); *H01L 29/165* (2013.01); *H01L 29/42316* (2013.01); *H01L 29/66545* (2013.01); *H01L 29/66553* (2013.01); *H01L 29/785* (2013.01); *H01L 29/7848* (2013.01)

(58) Field of Classification Search
CPC ......... H01L 21/02181; H01L 29/42316; H01L 21/2253; H01L 29/66553
See application file for complete search history.

(56) References Cited

U.S. PATENT DOCUMENTS

| | | | |
|---|---|---|---|
| 9,171,843 B2 | 10/2015 | Ching et al. | |
| 9,449,975 B1 | 9/2016 | Ching et al. | |
| 9,455,334 B2 | 9/2016 | Ching et al. | |
| 9,514,995 B1 | 12/2016 | Fogel et al. | |
| 9,627,476 B2 | 4/2017 | Diaz et al. | |
| 9,735,255 B2 | 8/2017 | Colinge et al. | |
| 10,242,917 B2 | 3/2019 | Kim et al. | |
| 10,276,568 B2 | 4/2019 | Wu et al. | |
| 10,403,717 B2 | 9/2019 | Lee et al. | |
| 2007/0093032 A1* | 4/2007 | Kobayashi | H01L 21/02148 257/E21.639 |
| 2008/0157091 A1* | 7/2008 | Shin | H01L 29/6656 257/E29.267 |
| 2011/0175152 A1* | 7/2011 | Booth, Jr. | H01L 28/40 257/350 |
| 2012/0153387 A1 | 6/2012 | Murthy et al. | |
| 2013/0040447 A1 | 2/2013 | Swaminathan et al. | |
| 2014/0203334 A1* | 7/2014 | Colinge | H01L 29/7853 257/288 |
| 2014/0213047 A1* | 7/2014 | Wang | H01L 21/823418 438/511 |
| 2015/0132909 A1 | 5/2015 | Choi et al. | |
| 2015/0187755 A1* | 7/2015 | Mehrotra | H01L 29/66628 257/192 |
| 2015/0187910 A1* | 7/2015 | Kim | H01L 29/7834 438/294 |
| 2015/0255457 A1 | 9/2015 | Loubet et al. | |
| 2016/0293697 A1* | 10/2016 | Kim | H01L 29/0847 |
| 2016/0308004 A1 | 10/2016 | Lee et al. | |
| 2016/0322358 A1 | 11/2016 | Ching et al. | |
| 2017/0005002 A1 | 1/2017 | Ching et al. | |
| 2017/0104011 A1* | 4/2017 | Zang | H01L 27/1207 |
| 2017/0117362 A1 | 4/2017 | Kim et al. | |
| 2017/0125413 A1 | 5/2017 | Wu et al. | |
| 2017/0345895 A1* | 11/2017 | Sarkozy | H01L 29/42356 |
| 2018/0061664 A1* | 3/2018 | Saito | H01L 21/47 |
| 2018/0089479 A1* | 3/2018 | Jagannathan | G06K 7/1413 |
| 2018/0151706 A1* | 5/2018 | Lin | H01L 29/785 |

* cited by examiner

SEMICONDUCTOR DEVICES AND METHODS OF FABRICATING THE SAME

CROSS-REFERENCE TO RELATED APPLICATION

This application is a continuation of U.S. patent application Ser. No. 15/869,718, filed Jan. 12, 2018, which claims priority under 35 U.S.C. 119 to Korean Patent Application No. 10-2017-0148218 filed on Nov. 8, 2017 in the Korean Intellectual Property Office, the disclosure of which is hereby incorporated by reference in its entirety.

BACKGROUND

The present disclosure generally relates to the field of electronics and, more particularly, semiconductor devices and methods of fabricating the same.

Semiconductor devices may include an integrated circuit including metal oxide semiconductor field effect transistors (MOSFETs). As semiconductor devices become highly integrated, the scale down of the MOSFETs is also being accelerated, and thus operating characteristics of the semiconductor devices may deteriorate. Various technologies have been developed to fabricate semiconductor devices having superior performance and high integration density. For example, technologies increasing mobility of carriers (e.g., electrons or holes) have been developed.

SUMMARY

A method of forming an integrated circuit device may include implanting dopants into a substrate to form a preliminary impurity region in the substrate and heating the substrate to convert the preliminary impurity region into an impurity region. Heating the substrate may be performed at an ambient temperature of from about 800° C. to about 950° C. for from about 20 min to about 50 min. The method may also include forming a first trench and a second trench in the impurity region to define an active fin between the first trench and the second trench and forming a first isolation layer and a second isolation layer in the first trench and the second trench, respectively. The active fin may protrude beyond upper surfaces of the first and second isolation layers such that the first and second isolation layers may expose opposing sides of the active fin. The method may further include forming a gate insulation layer extending on the opposing sides and an upper surface of the active fin and forming a gate electrode traversing the active fin.

A method of forming an integrated circuit device may include sequentially forming a first epitaxial layer and a second epitaxial layer on a substrate. The first epitaxial layer may include a material different from the second epitaxial layer, and a thickness of the first epitaxial layer may be from about 10 Å to about 100 Å. The method may also include implanting dopants into the second epitaxial layer to form a preliminary impurity region in the second epitaxial layer, heating the substrate to convert the preliminary impurity region into an impurity region, forming a third epitaxial layer on the substrate after heating the substrate, forming a first trench and a second trench in the third epitaxial layer and the impurity region to define an active fin between the first trench and the second trench, and forming a first isolation layer and a second isolation layer in the first trench and the second trench, respectively. The active fin may protrude beyond upper surfaces of the first and second isolation layers such that the first and second isolation layers may expose opposing sides of the active fin. The method may further include forming a gate insulation layer extending on the opposing sides and an upper surface of the active fin and forming a gate electrode traversing the active fin.

A method of forming an integrated circuit device may include implanting first dopants into a substrate to form a preliminary impurity region in the substrate, heating the substrate to convert the preliminary impurity region into an impurity region, forming an undoped semiconductor layer on the substrate after heating the substrate, forming a first trench and a second trench in the undoped semiconductor layer and the impurity region to define an active fin between the first trench and the second trench, and forming a first isolation layer and a second isolation layer in the first trench and the second trench, respectively. The first dopants have a first conductivity type. The active fin may protrude beyond upper surfaces of the first and second isolation layers such that the first and second isolation layers may expose opposing sides of the active fin. The method may also include forming a pair of source/drain regions in the undoped semiconductor layer thereby defining a channel region in the undoped semiconductor layer between the pair of source/drain regions, forming a gate insulation layer extending on the opposing sides and an upper surface of the active fin, and forming a gate electrode traversing the active fin. The pair of source/drain regions may include second dopants that have a second conductivity type that is opposite the first conductivity type. The active fin may extend longitudinally in a horizontal direction in a plan view. The channel region may include a middle portion in the horizontal direction, and the middle portion of the channel region may include some of the second dopants diffused from the pair of source/drain regions. A concentration of the some of the second dopants in the middle portion of the channel region may be about 5E18~5E20 atoms/cm after forming the gate electrode.

DETAILED DESCRIPTION

Semiconductor devices and methods of fabricating the same according to example embodiments of the present inventive concepts will be discussed in conjunction with the accompanying drawings. Like reference numbers refer to like elements throughout.

As used herein the term "and/or" includes any and all combinations of one or more of the associated listed items.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or mom blocks of the flowcharts and/or block diagrams may be at least partially integrated. Finally, other blocks may be added/inserted between the blocks that are illustrated, and/or blocks/operations may be omitted without departing from the scope of the present inventive concepts.

Figure 1:
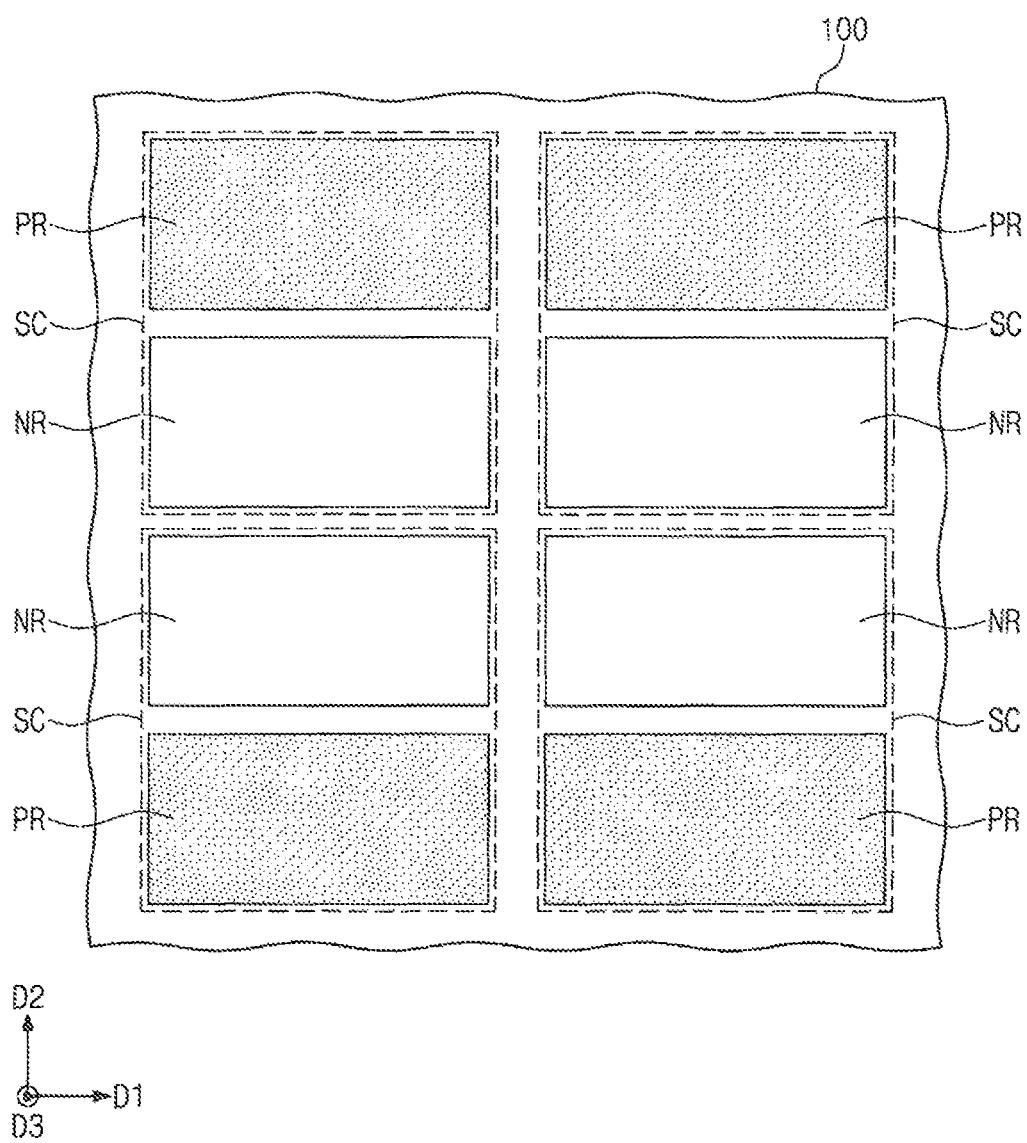
FIG. 1 illustrates a simplified plan view of a semiconductor device according to example embodiments of the present inventive concepts.

FIG. 1 illustrates a simplified plan view of a semiconductor device according to example embodiments of the present inventive concepts.

Referring to FIG. 1, a semiconductor substrate 100 may include P-well regions PR where NMOS field effect transistors are formed and N-well regions NR where PMOS field effect transistors are formed. In some embodiments, the P-well regions PR and the N-well regions NR may be spaced apart from each other in a first direction D1 or a second direction D2 as illustrated in FIG. 1. The first and second direction D1 and D2 may be substantially parallel to an upper surface of the substrate 100 and may be referred to as a first horizontal direction and a second horizontal direction. A third direction D3 may be substantially perpendicular to both the first and second direction D1 and D2 and may be referred to as a vertical direction.

In some embodiments, a P-well region PR and a N-well region NR may be included in a standard cell SC that includes NMOS and PMOS field effect transistors. In some embodiments, each of the standard cells SC may include one P-well region PR and one N-well region NR. For example, the standard cells SC may include logic devices, such as logical sum gates or logical product gates, integrated on the semiconductor substrate 100. For example, the standard cells SC may also include a basic cell such as AND gate, OR gate, NOR gate, or INVERTER, a complex cell such as OAI (OR/AND/INVERTER) gate or AOI (AND/OR/INVERTER) gate, or a storage element such as master-slave flip-flop, latch, or SRAM.

Figure 2:
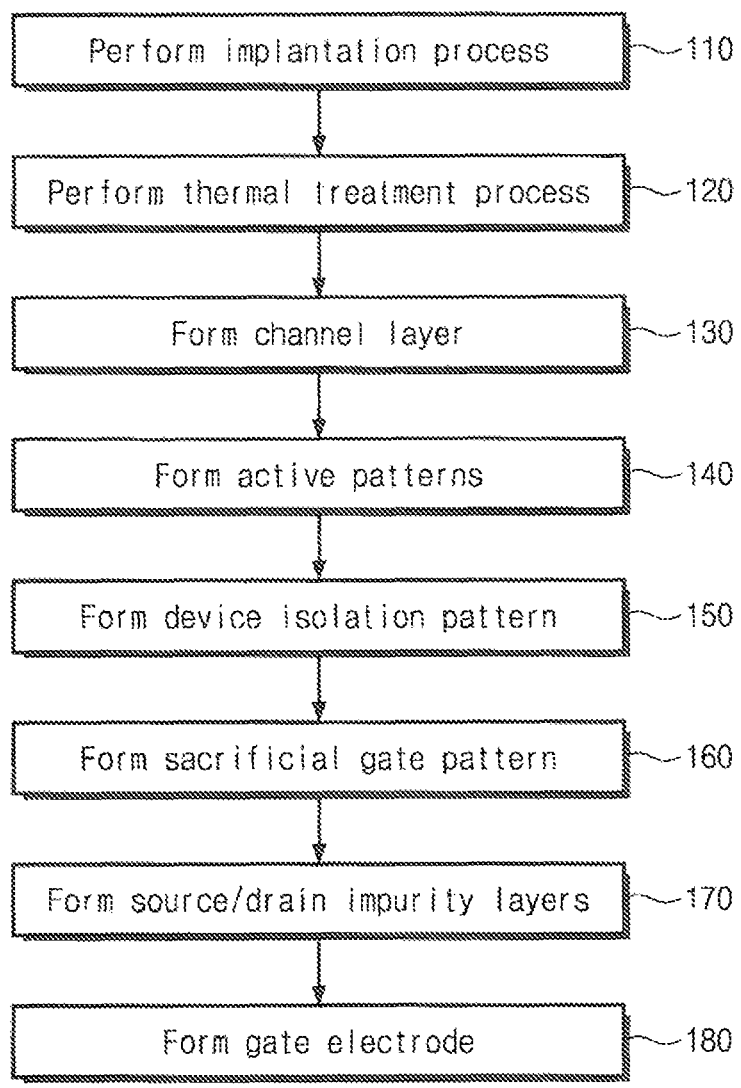
FIG. 2 is a flow chart showing a method of fabricating a semiconductor device according to example embodiments of the present inventive concepts.
Figure 3:
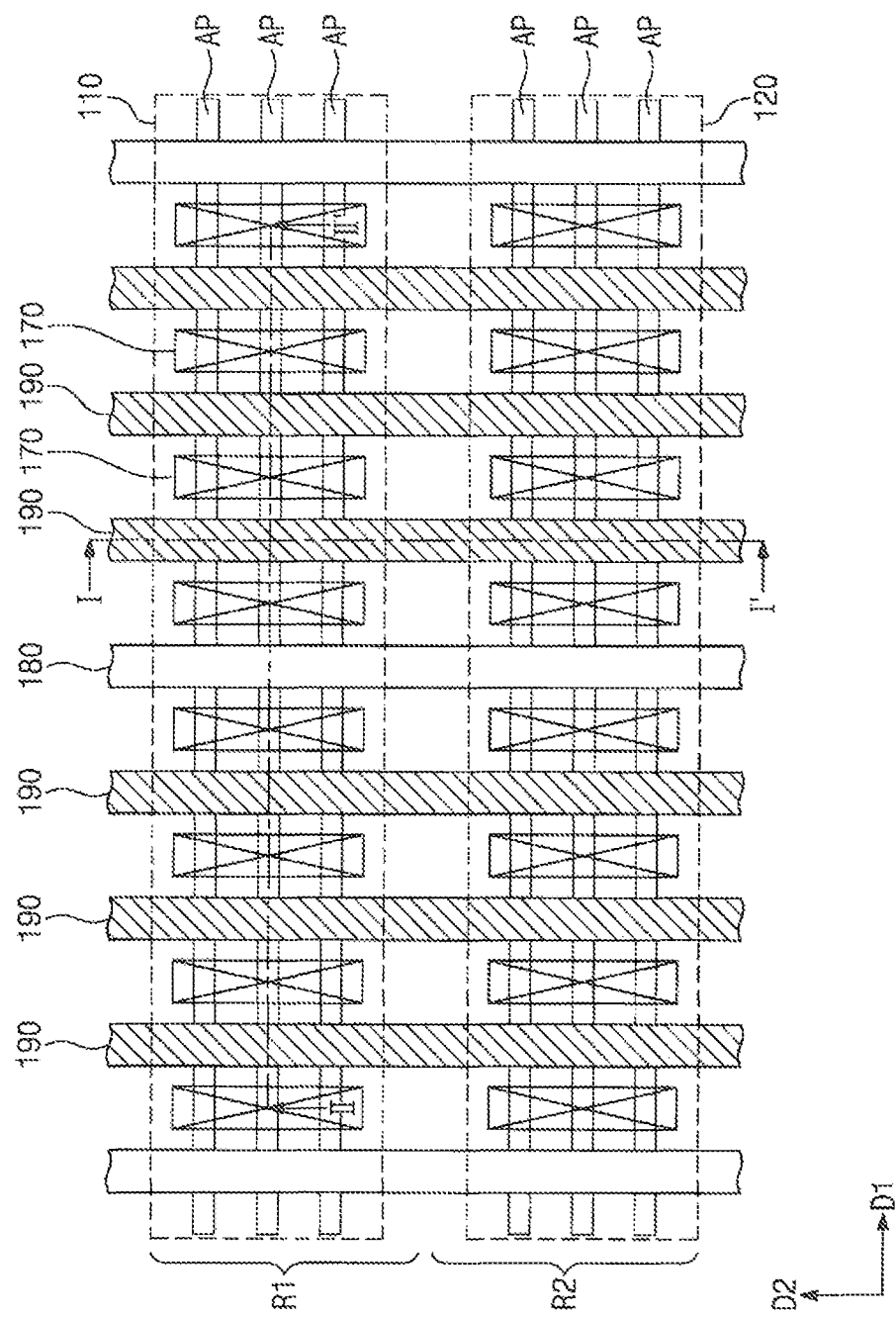
FIG. 3 illustrates a plan view of a semiconductor device according to example embodiments of the present inventive concepts.
Figure 4:
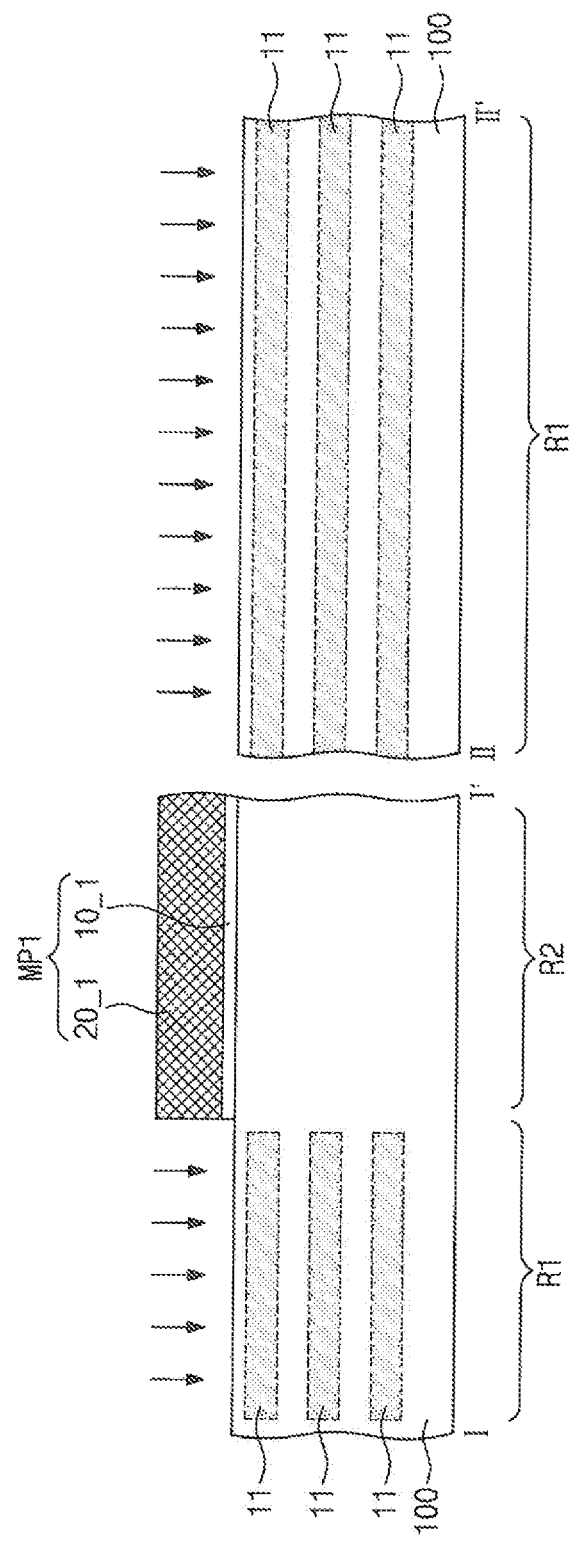
FIGS. 4, 5, 6, 7, 8, 9, 10, 11, 12, 13 and 14 illustrate cross-sectional views taken along the lines I-I' and II-II' of FIG. 3 showing a method of fabricating a semiconductor device according to example embodiments of the present inventive concepts.

FIG. 2 is a flow chart illustrating a method of fabricating a semiconductor device according to example embodiments of the present inventive concepts. FIG. 3 illustrates a plan view of a semiconductor device according to example embodiments of the present inventive concepts, FIGS. 4 through 14 illustrate cross-sectional views taken along the lines I-I' and II-II' of FIG. 3 showing a method of fabricating a semiconductor device according to example embodiments of the present inventive concepts.

Referring to FIGS. 2, 3, 4, and 5, a semiconductor substrate 100 may include first and second regions R1 and R2. In some embodiments, NMOS field effect transistors may be provided on the first region R1, and PMOS field effect transistors may be provided on the second region R2.

For example, the semiconductor substrate 100 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). In some embodiments, the semiconductor substrate 100 may be a III-V group compound semiconductor substrate. The III-V group compound semiconductor substrate may include, for example, one or more of gallium arsenide (GaAs), indium gallium arsenide (InGaAs), aluminum gallium arsenide (AlGaAs), and a mixture thereof. In some embodiments, the semiconductor substrate 100 may be a bulk silicon substrate doped with n-type impurities or p-type impurities.

A first conductivity-type dopant may be implanted into the first region R1 of the semiconductor substrate 100, and a second conductivity-type dopant may be implanted into the second region R2 of the semiconductor substrate 100 (Block 110).

In detail, a first mask pattern MP1 may be formed on the semiconductor substrate 100 to expose the first region R of the semiconductor substrate 100. The first mask pattern MP1 may include a first silicon oxide layer pattern 10_1 and a first silicon nitride layer pattern 20_1 sequentially stacked.

First implant regions 11 may be formed by implanting a first conductivity-type (e.g., an n-type conductivity) dopant into the first region R1 of the semiconductor substrate 100 using the first mask pattern MP1 as an ion implantation mask. For example, when the first implant regions 1 are formed, an n-type impurity (e.g., phosphorus (P), arsenic (As), or antimony (Sb)) may be implanted at a dose amount ranging from about 1E13 atoms/cm$^2$ to about 5E15 atoms/cm$^2$.

When the ion implantation process is performed, an ion implantation energy may be controlled to form the first implant regions 11 at different depths in the first region R1 of the semiconductor substrate 100. When the first implant regions 1 are formed, the semiconductor substrate 100 including a single-crystalline material may be implanted with ions accelerated at high energy, and thus crystallinity of the semiconductor substrate 100 may be broken, such that a single crystalline structure of the semiconductor substrate 100 may become an amorphous structure. After forming the first implant regions 11, the first mask pattern MP1 may be removed.

Figure 5:
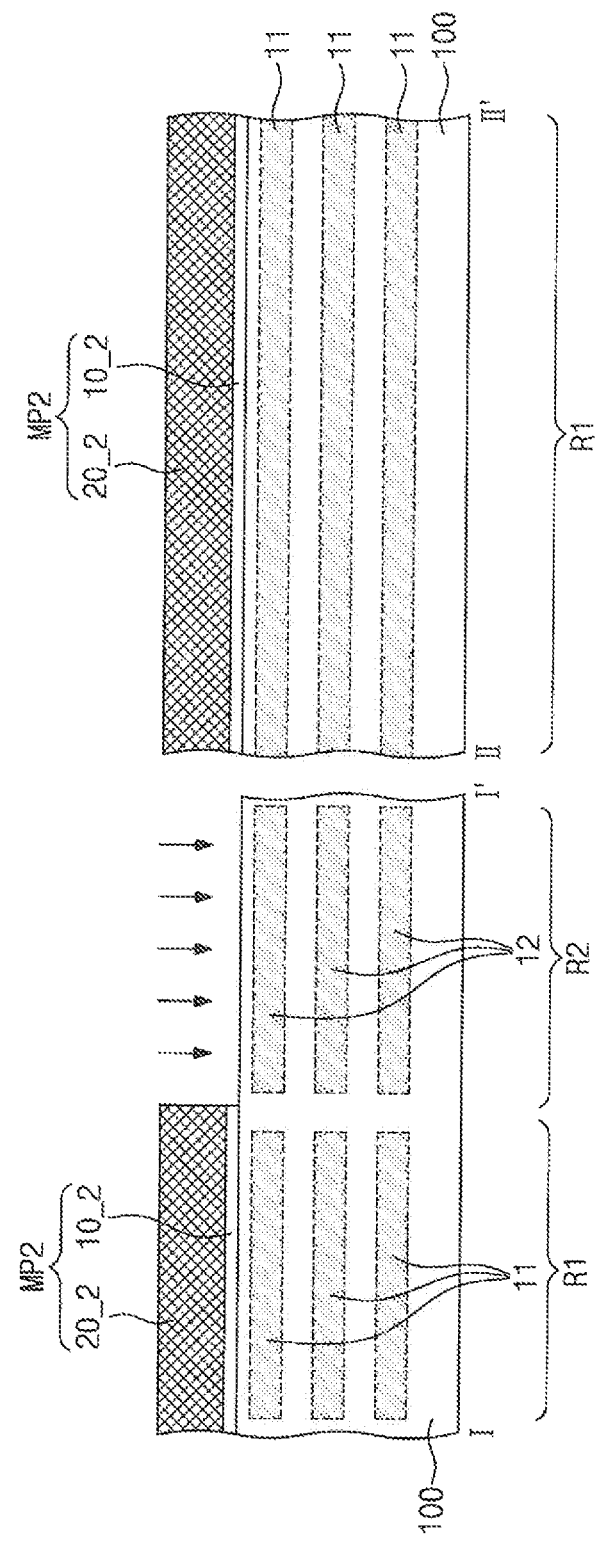

Referring to FIGS. 3 and 5, a second mask pattern MP2 may be formed on the semiconductor substrate 100 to expose the second region R2 of the semiconductor substrate 100. Likewise the first mask pattern MP1, the second mask pattern MP2 may include a second silicon oxide layer pattern 10_2 and a second silicon nitride layer pattern 20_2 sequentially stacked.

Second implant regions 12 may be formed by implanting a second conductivity-type (e.g., a p-type conductivity) dopant into the second region R2 of the semiconductor substrate 100 using the second mask pattern MP2 as an ion implantation mask. For example, when the second implant regions 12 are formed, a p-type impurity (e.g., boron (B)) may be implanted at a dose amount ranging from about 1E13 atoms/cm$^2$ to about 5E15 atoms/cm$^2$.

When the ion implantation process is performed, an ion implantation energy may be controlled to form the second implant regions 12 at different depths in the semiconductor substrate 100 of the second region R2. As discussed above, a portion of the semiconductor substrate 100 may become amorphous by the ion implantation process. After forming the second implant regions 12, the second mask pattern MP2 may be removed.

In some embodiments, the first and second implant regions 11 and 12 may be respectively formed in the first and second regions R1 and R2, but the present inventive concepts are not limited thereto. In some embodiments, second implant regions 12 may not be formed.

Figure 6:
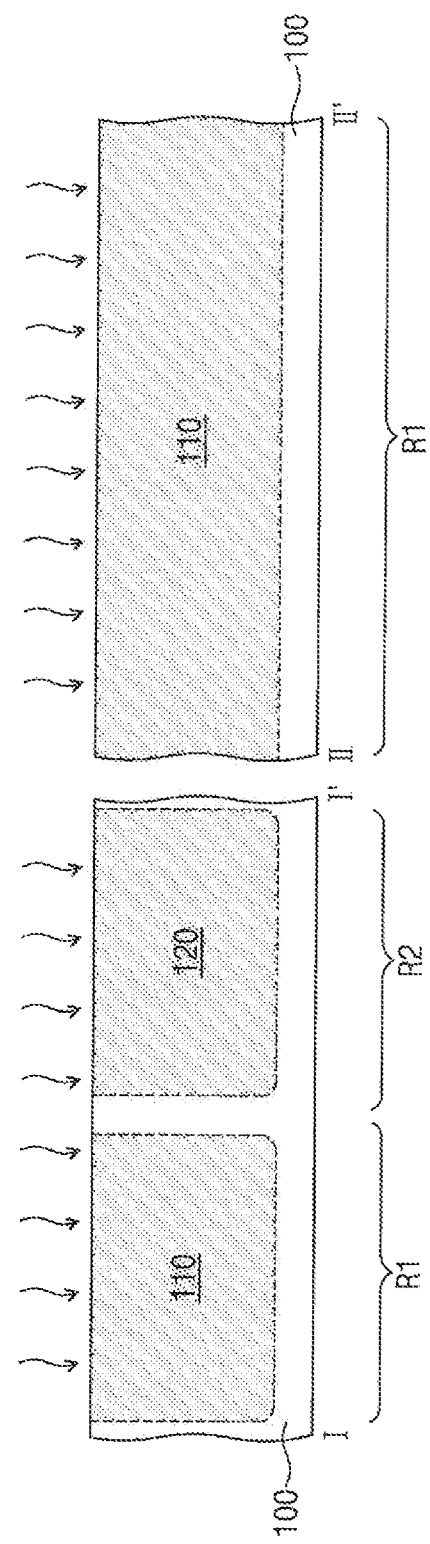

Referring to FIGS. 2, 3, and 6, after the first and second implant regions 11 and 12 are formed, a thermal treatment process may be performed on the semiconductor substrate 100 (Block 120).

In some embodiments, the thermal treatment process may be a rapid thermal annealing (RTA) process, in some embodiments, the thermal treatment process may be performed at an ambient temperature ranging from about 500° C. to about 1200° C. In some embodiments, the thermal treatment process may be performed at an ambient temperature of about 800° C. to about 950° C., more specifically, about 850° C. to about 900° C., for about 20 min to about 50 min. As appreciated by the present inventors, if the thermal treatment process is performed at an ambient temperature higher than 950° C., the first conductivity-type dopant of the first implant regions 11 may diffuse into the second implant regions 12, and the second conductivity-type dopant of the second implant regions 12 may diffuse into the first implant regions 11. Accordingly, in some embodiments, the thermal treatment process may be performed at an ambient temperature lower than 950° C. to reduce or possibly prevent diffusion of the first conductivity-type dopant into the second implant regions 12 and/or diffusion of the second conductivity-type dopant into the first implant regions 11.

During the thermal treatment process, dopants in the first implant regions 1 may diffuse to form a first well impurity layer 110 in the first region R1 of the semiconductor substrate 100, and dopants in the second implant regions 12 may diffuse to form a second well impurity layer 120 in the second region R2 of the semiconductor substrate 100. Since the first implant regions 11 and the second implant regions 12 are converted into the first well impurity layer 110 and the second well impurity layer 120, respectively, the first implant regions 11 may be referred to as preliminary first implant regions, and the second implant regions 12 may be referred to as preliminary second implant regions.

For example, the first well impurity layer 110 may include an n-type dopant (e.g., arsenic (As)) whose concentration falls within a range of from about $1\times10^{18}$ atoms/cm$^3$ to about $1\times10^2$ atoms/cm. The second well impurity layer 120 may include a p-type dopant (e.g., boron (B)) whose concentration falls within a range of from about $1\times10^{18}$ atoms/cm to about $1\times10^{20}$ atoms/cm.

The thermal treatment process may recrystallize portions of the semiconductor substrate 100, which became amorphous when the first and second implant regions 11 and 12 were formed. When the semiconductor substrate 100 is recrystallized, single crystalline silicon may regrow from bottom surfaces toward top surfaces of the first and second well impurity layers 110 and 120. As appreciated by the present inventors, since the amorphous portions of the semiconductor substrate 100 are recrystallized before patterning the semiconductor substrate 100 (i.e. before forming active patterns AP), crystal defect (e.g., stacking faults) formation may be reduced or possibly prevented during the recrystallization. The semiconductor substrate 100 may thus have lower crystal defect density, and in some embodiments, may be defect-free, in the first and second well impurity layers 110 and 120.

Figure 7:
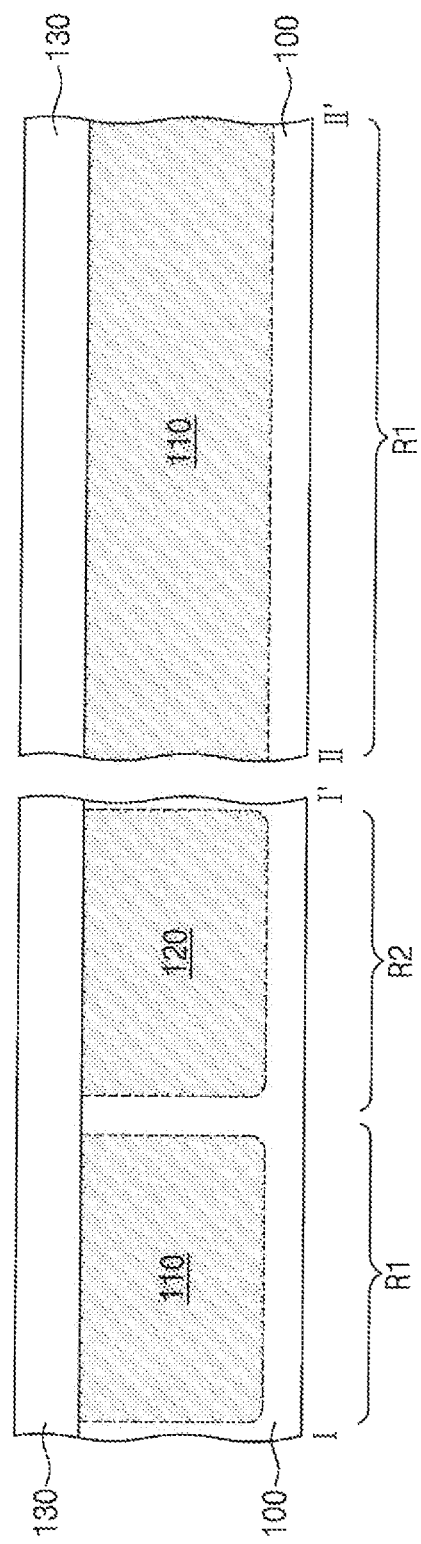

Referring to FIGS. 2, 3, and 7, a channel layer 130 may be formed on upto the entire surface of the semiconductor substrate 100 including the first and second well impurity layers 110 and 120 (Block 130).

In some embodiments, forming the channel layer 130 may include forming an undoped semiconductor layer. In some embodiments, an impurity may be in-situ doped into the channel layer 130 while forming the channel layer 130. The channel layer 130 may be formed by, for example, performing an epitaxial growth process in which the semiconductor substrate 100 is used as a seed. The epitaxial growth process may include a vapor phase epitaxy (VPE), a liquid phase epitaxy (LPE), and/or a molecular beam epitaxy (MBE). In some embodiments, the channel layer 130 may be epitaxially grown to have a thickness of about 300 Å to about 700 Å. As the channel layer 130 is formed on the regrown semiconductor substrate 100 that include a low density of crystal defects, crystal defect formation may be reduced or possibly prevented when the channel layer 130 is grown.

The channel layer 130 may include a single crystalline silicon layer that is substantially the same as or similar to the semiconductor substrate 100. In some embodiments, the channel layer 130 may include a silicon-germanium ($Si_{1-x}Ge_x$, where $0<x<1$) layer doped with germanium (Ge) during the epitaxial growth process. For example, the channel layer 130 may include a semiconductor material whose lattice constant is different from that of the semiconductor substrate 100.

In some embodiments, separate channel layers 130 may be formed on the first and second regions R1 and R2, respectively. For example, a first channel layer may be formed on the first region R1, and a second channel layer may be formed on the second region R2. The first and second channel layers may have different lattice constants from each other. For example, the first channel layer may be a silicon-germanium layer, and the second channel layer may be a silicon layer. In some embodiments, the channel layer 130 may include a plurality of epitaxial layers sequentially stacked, which may have different lattice constants from each other.

The channel layer 130 may be formed by forming an undoped semiconductor layer and, in some embodiments, may be substantially devoid of dopants as formed. In this description, "an undoped semiconductor layer" may refer to a semiconductor layer into which no impurity is intentionally doped. When the channel layer 130 is formed or after the channel layer 130 is formed, dopants may diffuse into the channel layer 130 from the first and second well impurity layers 110 and 120. In some embodiment, a portion of the channel layer 130 overlapping the first well impurity layer 110 may include first conductivity-type dopants diffused from the first well impurity layer 110, and a portion of the channel layer 130 overlapping the second well impurity layer 120 may include second conductivity-type dopants diffused from the second well impurity layer 120. In some embodiments, the portion of the channel layer 130 overlapping the first well impurity layer 110 may not include second conductivity-type dopants diffused from the second well impurity layer 120, and the portion of the channel layer 130 overlapping the second well impurity layer 120 may not include first conductivity-type dopants diffused from the first well impurity layer 110.

In some embodiments, a first conductivity-type dopant (e.g., an n-type dopant) concentration in a portion of the channel layer 130 on the first region R1 may be lower than that in the first impurity layer 110, and a second conductivity-type dopant (e.g., a p-type dopant) concentration in a portion of the channel layer 130 on the second region R2 may be lower than that in the second impurity layer 120. For example, the first conductivity-type dopant concentration (e.g., n-type dopant concentration) in the portion of the channel layer 130 on the first region R1 may fall within a range of from about $1 \times 10^{16}$ atoms/cm$^3$ to about $1 \times 10^{20}$ atoms/cm$^3$.

First conductivity-type dopants of the first impurity layer 110 and second conductivity-type dopants of the second impurity layer 120 may not reach an uppermost portion of the channel layer 130 by diffusion. Accordingly, when the channel layer 130 is formed as an undoped semiconductor layer, a first conductivity-type dopant concentration and a second conductivity-type dopant concentration in the uppermost portion of the channel layer 130 may be substantially zero.

Figure 8:
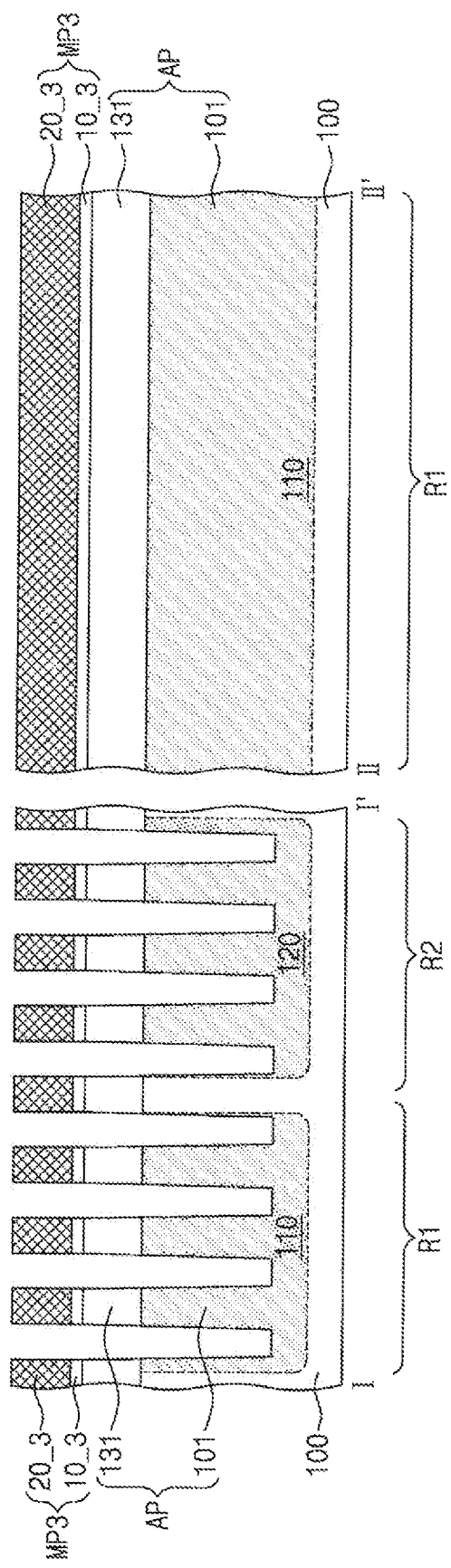

Referring to FIGS. 2, 3, and 8, the channel layer 130 and the semiconductor substrate 100 may be patterned to form active patterns AP (Block 140).

In some embodiments, the formation of the active patterns AP may include forming a third mask pattern MP3 to partially expose the channel layer 130 and anisotropically etching the channel layer 130 and the semiconductor substrate 100 using the third mask pattern MP3 as an etch mask to form device isolation trenches.

The third mask pattern MP3 may have a linear shape extending longitudinally in a first direction D1 and may include, likewise the first and second mask patterns (see MP1 of FIG. 4 and MP2 of FIG. 5), a third silicon oxide layer pattern 10_3 and a third silicon nitride layer pattern 20_3 sequentially stacked. The third mask pattern MP3 may be removed after forming the device isolation trenches or after filling the device isolation trenches with an insulting material.

In some embodiments, each of the active patterns AP may protrude from the semiconductor substrate 100 and may include a semiconductor pattern 101 including a portion of one of the first and second well impurity layers 110 and 120 and a channel pattern 131 on the semiconductor pattern 101. The active patterns AP may extend longitudinally in the first direction D1 and may be spaced apart from each other in a second direction D2. Each of the active patterns AP may have a tapered shape whose width gradually increases downward. In each of the active patterns AP, first or second dopant concentrations may be less in the channel pattern 131 than in the semiconductor substrate 100.

Figure 9:
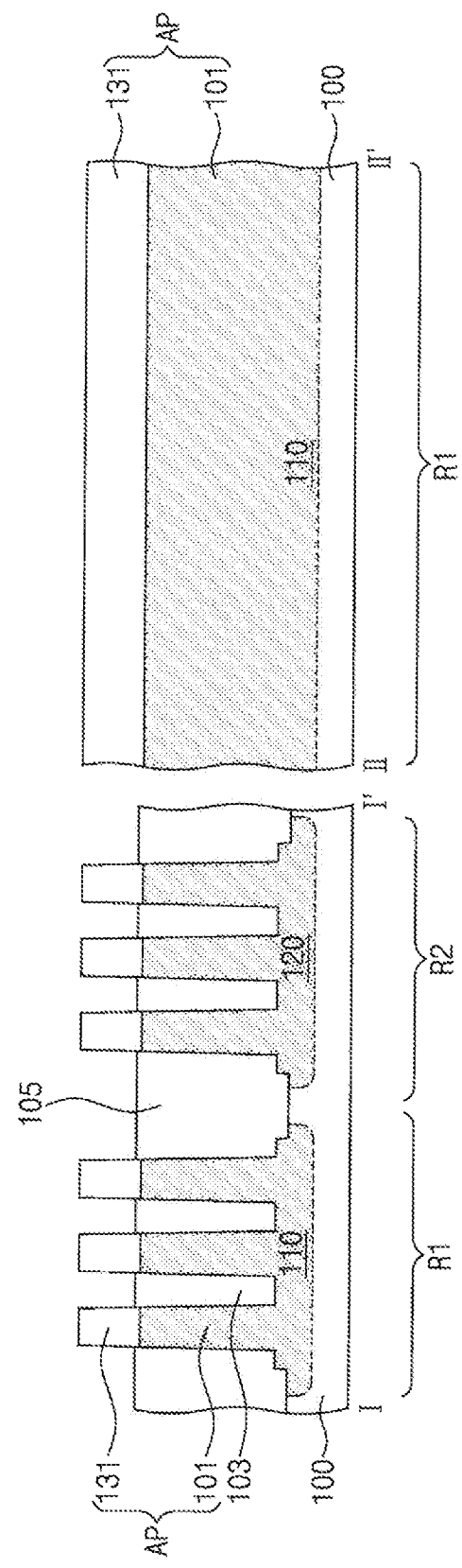

Referring to FIGS. 2, 3, and 9, first device isolation patterns 103 may be formed between the active patterns AP, and second device separation patterns 105 may be formed between the first and second well impurity layers 110 and 120 (Block 150).

The first device isolation patterns 103 may extend longitudinally in the first direction D1 and may separate neighboring active patterns AP from each other in the second direction D2. On each of the first and second regions R1 and R2, the first device isolation patterns 103 may fill spaces between the active patterns AP. The first device isolation patterns 103 may have top surfaces lower than that of the channel pattern 131 and may expose sidewalls of the channel pattern 131, as illustrated in FIG. 9. For example, the channel pattern 131 may protrude upward beyond the top surfaces of the first device isolation patterns 103.

The second device isolation patterns 105 may extend longitudinally in the first direction D1 between the first well impurity layer 110 and the second well impurity layer 120. The second device isolation pattern 105 may separate the first and second well impurity layers 110 and 120 from each other in the second direction D2. The second device isolation pattern 105 may have a width in the second direction D2 greater than that of the first device isolation pattern 103. The second device isolation pattern 105 may have a bottom surface that is at a level lower than or substantially the same level as a bottom surface of the first device isolation pattern 103.

The second device isolation pattern 105 may be formed by forming an insulating layer in the device isolation trenches, forming a deep isolation trench between the first and second well impurity layers 110 and 120, forming an insulating layer in the deep isolation trench, and recessing a top surface of the insulating layer.

Figure 10:
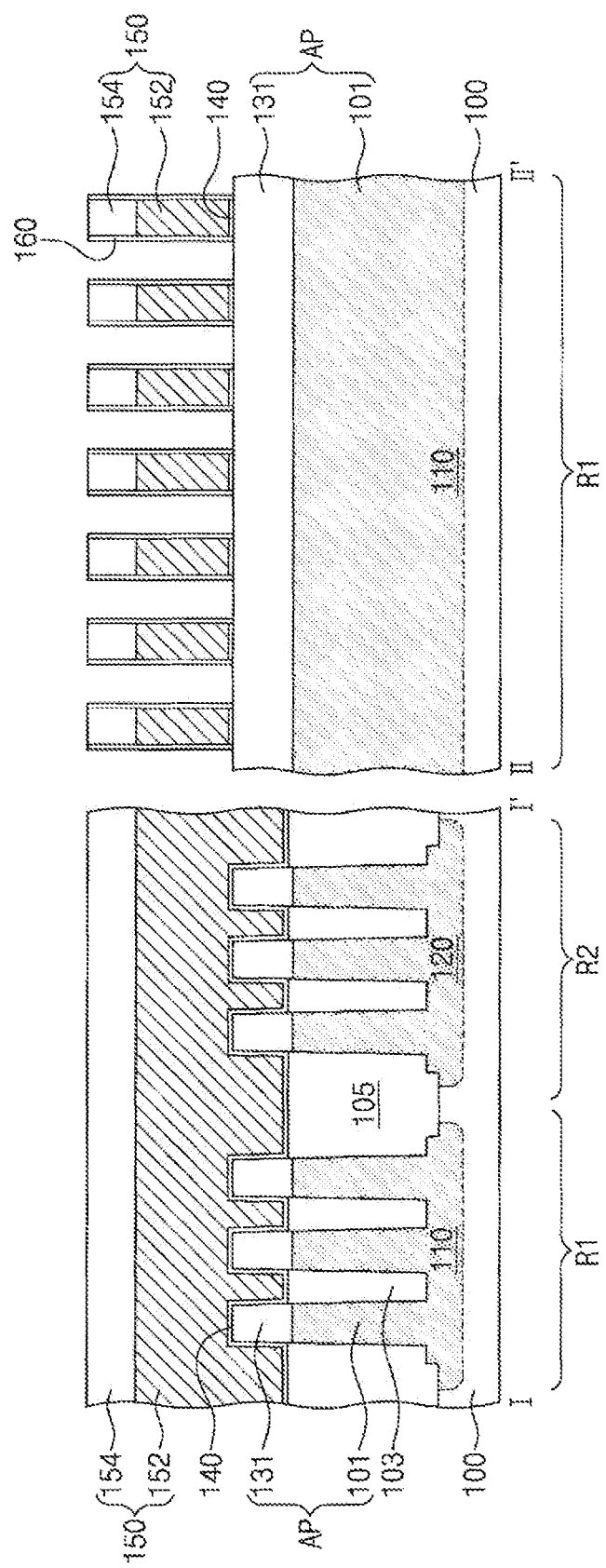

Referring to FIGS. 2, 3, and 10, sacrificial gate patterns 150 may be formed to cross the active patterns AP (Block 160).

A plurality of the sacrificial gate patterns 150 may extend in the second direction D2 and may be spaced apart from each other in the first direction D1 by a regular spacing. In some embodiments, the sacrificial gate patterns 150 may be formed to cross the first and second regions R1 and R2.

Each of the sacrificial gate patterns 150 may include a sacrificial pattern 152 and a hardmask pattern 154 sequentially stacked. The formation of the sacrificial gate patterns 150 may include forming a sacrificial layer to cover the active patterns AP, forming, on the sacrificial layer, a hardmask pattern 154 to cross the active patterns AP, and anisotropically etching the sacrificial layer using the hardmask pattern 154. The sacrificial layer may ill between channel patterns 131 and may be formed of a material having an etch selectivity with respect to the first and second device isolation patterns 103 and 105 and the channel patterns 131. For example, the sacrificial layer may be formed of an impurity-doped polysilicon layer, an undoped polysilicon layer, a silicon germanium layer, or a silicon carbide layer. The hardmask pattern 154 may be formed of a material, for example, a silicon nitride layer, having an etch selectivity with respect to the sacrificial layer.

Sacrificial gate insulating layers 140 may be formed before the sacrificial gate patterns 150 are formed. The sacrificial gate insulating layers 140 may be a silicon oxide layer, a silicon nitride layer, or a silicon oxynitride layer.

Gate spacers 160 may be formed on opposite sidewalls of each of the sacrificial gate patterns 150. The gate spacers 160 may be formed by forming a gate spacer layer that conformally covers the sacrificial gate patterns 150 and then anisotropically etching the gate spacer layer. The formation of the gate spacers 160 may expose the first and second device isolation patterns 103 and 105 and the channel patterns 131 on opposite sides of each sacrificial gate pattern 150.

Figure 11:
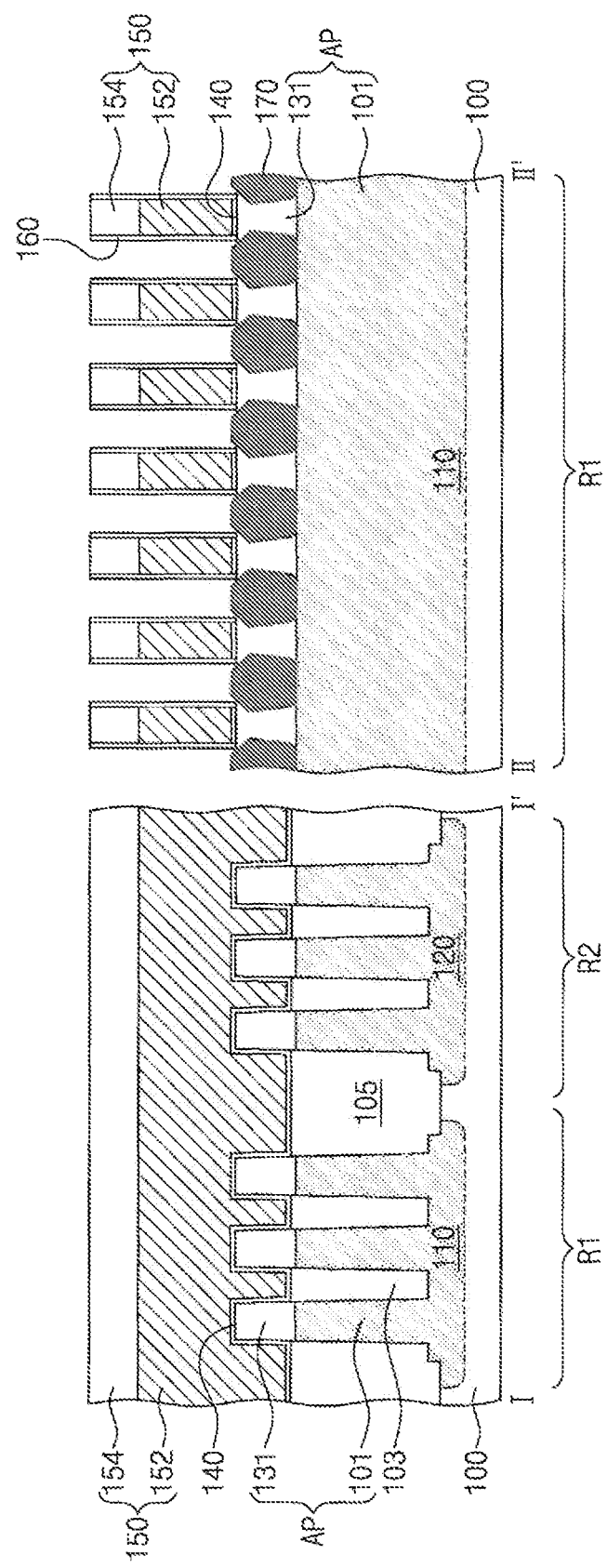

Referring to FIGS. 2, 3, and 11, source/drain impurity layers 170 may be formed in the active patterns AP on opposite sides of each sacrificial gate pattern 150 (Block 170).

The formation of the source/drain impurity layers 170 may include forming recess regions on the active patterns AP on opposite sides of each of the sacrificial gate patterns 150 and forming epitaxial layers in the recess regions. The recess regions may be formed by partially etching the active pattern AP exposed between the gate spacers 160. The recess regions may be formed by performing an anisotropic and/or isotropic etching processes in which the sacrificial gate patterns 150 and the gate spacers 160 are used as an etch mask. In some embodiments, the recess regions may be formed by isotropically or anisotropically etching the channel patterns 131 and may expose a top surface of the semiconductor pattern 101.

A selective epitaxial growth (SEG) process may be performed to form the source/drain impurity layers 170. The source/drain impurity layers 170 formed by the epitaxial growth process may be in contact with the semiconductor pattern 101 including the first or second well impurity layer 110 or 120.

For example, the formation of the source/drain impurity layers 170 may include forming first epitaxial layers for source/drain electrodes of PMOSFETs on the first region R1 and forming second epitaxial layers for source/drain electrodes of NMOSFETs on the second region R2. The first epitaxial layers on the first region R1 may be configured to induce a compressive strain, and the second epitaxial layers on the second region R2 may be configured to induce a tensile strain. For example, the first epitaxial layer may be formed of silicon germanium (SiGe), and the second epitaxial layer may be formed of silicon carbide (SiC), but the present inventive concepts are not limited thereto. In addition, the source/drain impurity layers 170 may each be provided thereon with a silicide layer such as nickel silicide, cobalt silicide, tungsten silicide, titanium silicide, niobium silicide, or tantalum silicide.

The source/drain impurity layers 170 of the first region R1 may be doped with a second conductivity-type dopant different from a first conductivity-type dopant of the first well impurity layer 110. The source/drain impurity layers 170 of the second region R2 may be doped with a first conductivity-type dopant different form a second conductivity-type dopant of the second well impurity layer 120.

In some embodiments, the source/drain impurity layers 170 may be formed by implanting dopants into the active patterns AP on opposite sides of each of the sacrificial gate patterns 150. As illustrated in FIG. 1, in some embodiments, upper surfaces of the channel patterns 131 may be closer to lower surfaces of the source/drain impurity layers 170 than lower surfaces of the first well impurity layer 110 and the second well impurity layer 120.

For example, a second conductivity-type dopant may be in-situ doped into the source/drain impurity layers 170 during their formation on the first region R1, and a first conductivity-type dopant may be in-situ doped into the source/drain impurity layers 170 during their formation on the second region R2. The source/drain impurity layers 170 of the first region R1 may have a second conductivity-type dopant concentration ranging from about $1 \times 10^{20}$ atoms/cm$^3$ to about $1 \times 10^{20}$ atom/cm$^2$. The source/drain impurity layers 170 of the second region R2 may have a first conductivity-type dopant concentration ranging from about $1 \times 10^{20}$ atoms/cm$^3$ to about $1 \times 10^{21}$ atoms/cm$^3$.

Figure 12:
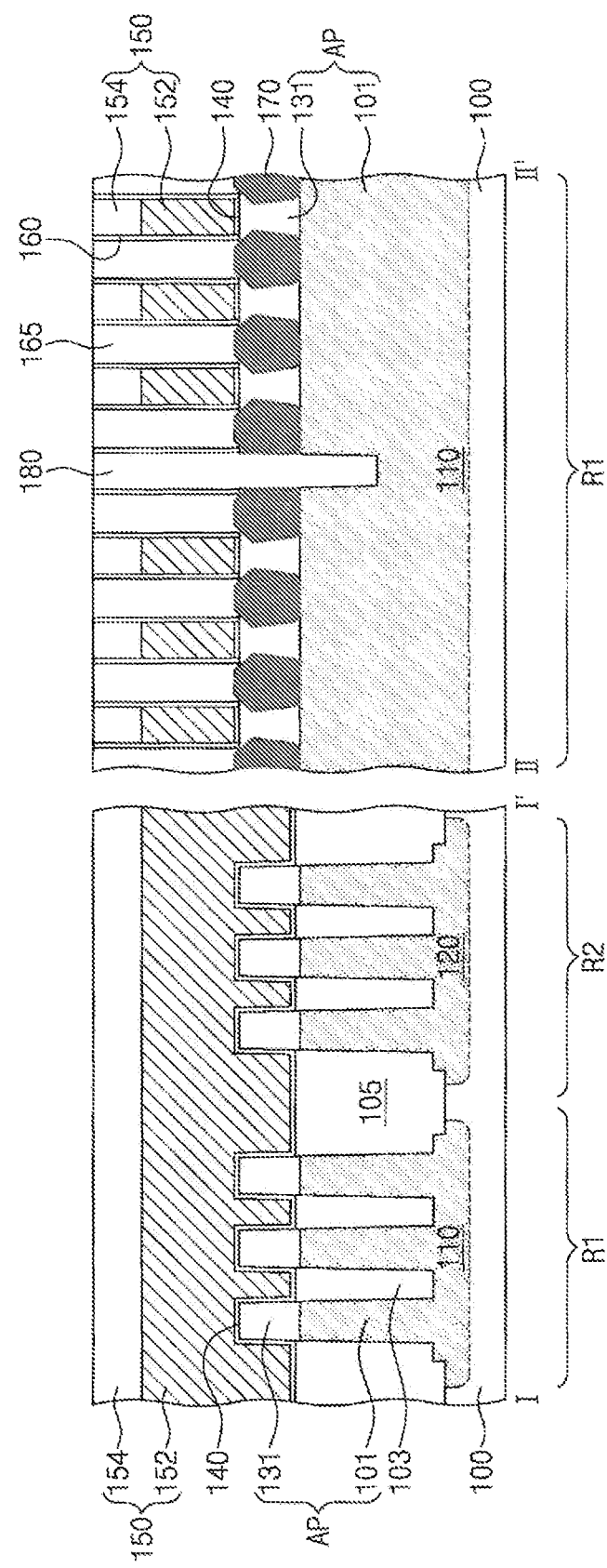

Referring to FIGS. 2, 3, and 12, an interlayer dielectric layer 165 may be formed between the source/drain impurity layers 170 and the sacrificial gate patterns 150. The interlayer dielectric layer 165 may expose top surfaces of the sacrificial gate patterns 150.

For example, the interlayer dielectric layer 165 may be formed by depositing an insulating layer to fill between the sacrificial gate patterns 150 and then performing a planarization process until top surfaces of the hardmask patterns 154 are exposed. The interlayer dielectric layer 165 may include, for example, a silicon oxide layer, which may be formed by an FCVD (Flowable Chemical Vapor Deposition) process. An etch-back or chemical mechanical polishing (CMP) process may be performed to planarize the interlayer dielectric layer 165. The planarization process may decrease thicknesses of the hardmask patterns 154.

Third device isolation patterns 180 may be formed to extend in the second direction D2 and to cross the first and second well impurity layers 110 and 120.

The formation of the third device isolation patterns 180 may include removing one of the sacrificial gate patterns 150 to expose the active patterns AP, anisotropically etching the active patterns AP to form a separation trench, and filling the separation trench with an insulating layer. The separation trench may extend in the second direction D2 and may separate each active pattern AP into pieces in the first direction D1. The third device isolation pattern 180 may have a top surface higher than those of the active patterns AP and/or those of the channel patterns 131 as illustrated in FIG. 12.

Figure 13:
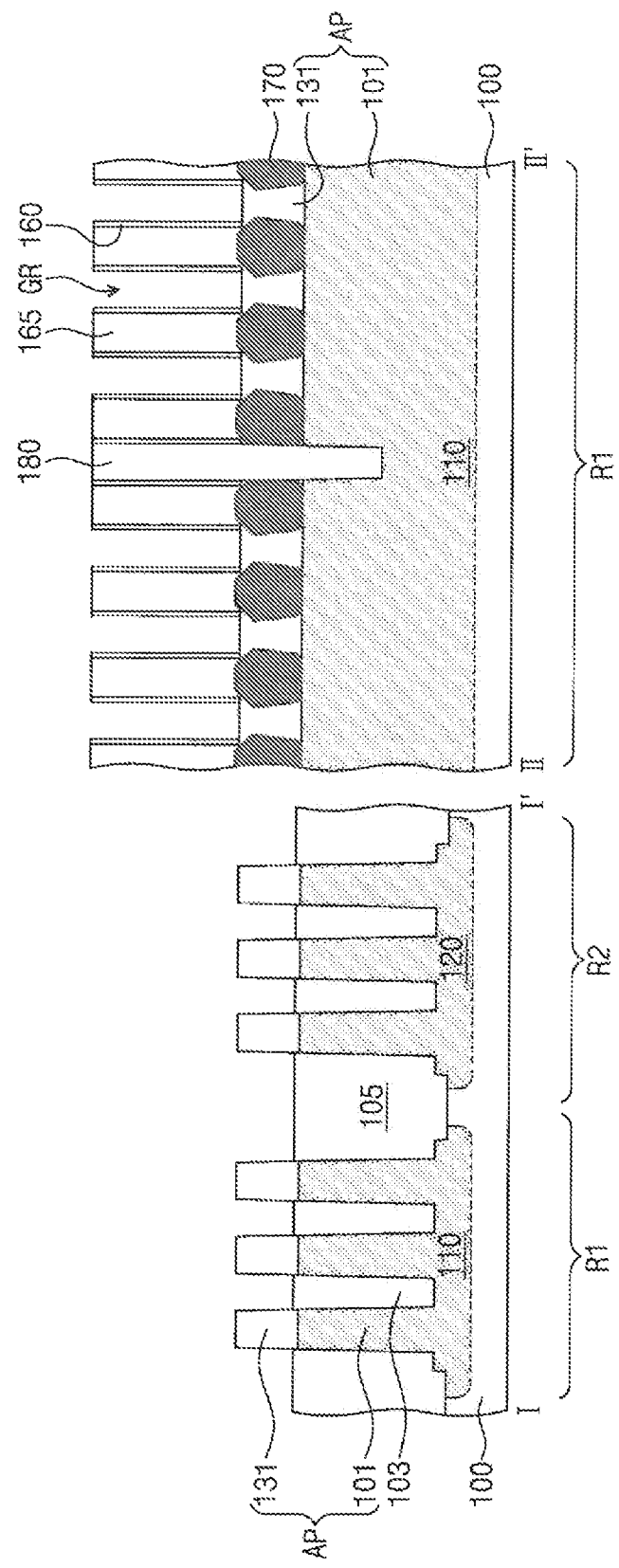

Referring to FIGS. 2, 3, and 13, the sacrificial gate patterns 150 and the sacrificial gate insulating layers 140 may be removed to form gate regions GR each between the gate spacers 160.

The formation of the gate regions GR may include sequentially etching the sacrificial gate patterns 150 and the sacrificial gate insulating layers 140 using an etch recipe having an etch selectivity with respect to the gate spacers 160 and the interlayer dielectric layer 165.

Each of the gate regions GR may expose upper portions of the active patterns AP and/or the channel patterns 131, and sidewalls of the gate spacers 160 may be exposed to the gate regions GR. The first and second device isolation patterns 103 and 105 between the active patterns AP may also be partially exposed to the gate regions GR. The gate regions GR may be formed to have a vertical depth that is greater on the first and second device isolation patterns 103 and 105 than on the active pattern AP.

Figure 14:
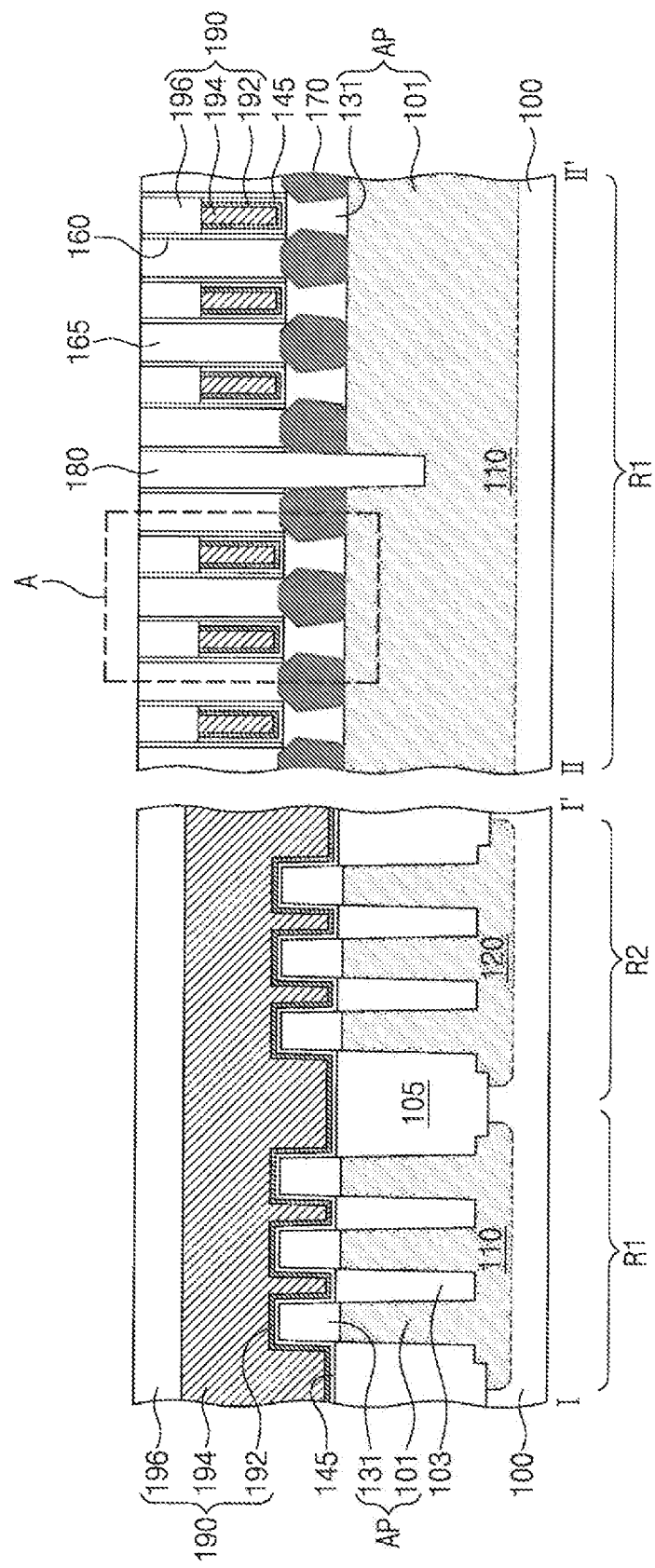

Referring to FIGS. 2, 3, and 14, a gate dielectric layer 145 and a gate electrode 190 may be sequentially formed in each of the gate regions GR (Block 180).

The gate dielectric layer 145 may be formed by an atomic layer deposition (ALD) to conformally cover surfaces of the active patterns AP exposed to the gate regions GR and the sidewalls of the gate spacers 160 exposed to the gate regions GR. The gate dielectric layer 145 may be formed of a high-k dielectric layer such as hafnium oxide, hafnium silicate, zirconium oxide, or zirconium silicate.

The gate electrodes 190 may be formed to extend in the second direction D2 and to cross the active patterns AP of the first and second regions R1 and R2 and may be spaced apart from each other in the first direction D1. Each of the gate electrodes 190 may include a gate barrier metal pattern 192, a gate metal pattern 194, and a capping insulating pattern 196.

The gate barrier metal pattern 192 may be formed of a conductive material having a predetermined work function, for example, a metal nitride layer such as titanium nitride, tantalum nitride, tungsten nitride, hafnium nitride, and zirconium nitride. The gate metal pattern 194 may be formed of a material whose resistivity is less than that of the gate barrier metal pattern 192. The gate metal pattern 194 may be formed of for example, tungsten, copper, hafnium, zirconium, titanium, tantalum, aluminum, ruthenium, palladium, platinum, cobalt, nickel, conductive metal nitride, or a combination thereof.

The capping insulating pattern 196 may cover a top surface of the gate metal pattern 194. The capping insulating patterns 196 may have top surfaces substantially coplanar with that of the interlayer dielectric layer 165. The capping insulating pattern 196 may include, for example, silicon oxide, silicon nitride, silicon oxynitride, silicon carbon nitride (SiCN), or silicon carbon oxynitride (SiCON).

Although FIG. 2 describes that the method includes forming the sacrificial gate patterns and replacing the sacrificial gate patterns with the gate electrodes as illustrated in FIGS. 10 through 14, it will be understood that the gate electrodes can be formed without forming the sacrificial gate patterns. When the gate electrodes are formed without forming the sacrificial gate patterns, the source/drain impurity layers 170 may be formed after the gate electrodes are formed.

Figure 14A:
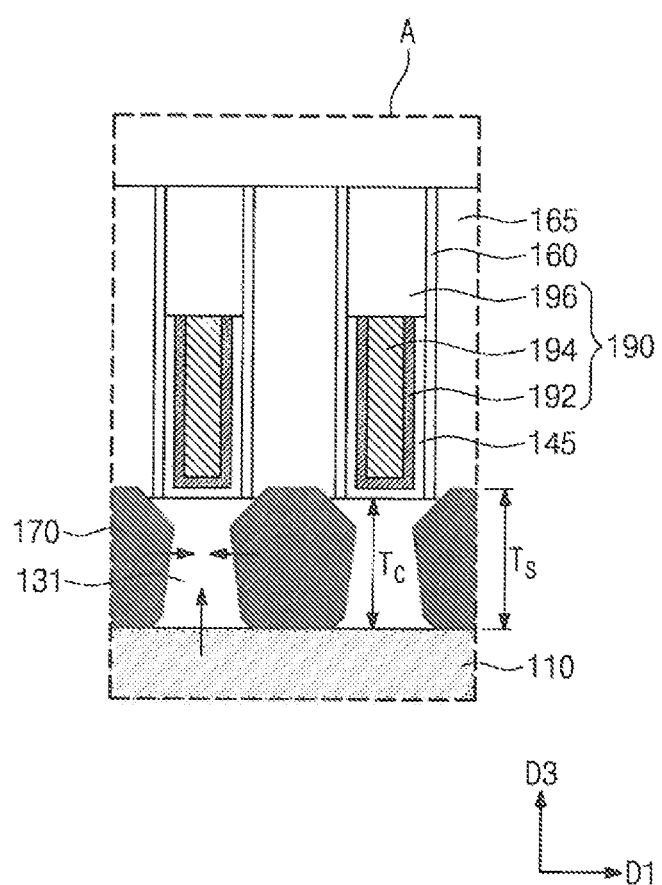
FIG. 14A is an enlarged view of the region A of FIG. 14.

FIG. 14A is an enlarged view of the region A of FIG. 14 illustrating diffusion of dopants into a portion of the channel patterns 131 overlapping the first well impurity layer 110. First conductivity-type dopants (e.g., n-type conductivity dopants) of the first well impurity layer 110 may diffuse into the channel patterns 131, and second conductivity-type dopants (e.g., p-type conductivity dopants) of the source/drain impurity layers 170 may diffuse into the channel patterns 131 while the processes illustrated in FIGS. 7 through 14 are performed. Accordingly, a first conductivity-type dopant concentration and a second conductivity-type dopant concentration of the channel patterns 131 may increase as the processes progress. For example, when the channel layer 130 is formed as an undoped semiconductor layer, the portion of the channel patterns 131 overlapping the first well impurity layer 110 may have an average first conductivity-type dopant concentration lower than about 5E20 atoms/cm$^3$ after the gate electrodes 190 are formed, and a middle portion of this channel patterns 131 between the source/drain impurity layers 170 may have a second conductivity-type dopant concentration of about 5E18~5E20 atoms/cm$^3$ after the gate electrodes 190 are formed. In some embodiments, when the channel layer 130 is formed as an undoped semiconductor layer, a ratio of an average first conductivity-type dopant concentration in the channel patterns 131 to a second conductivity-type dopant concentration in the middle portion of the channel patterns 131 may be from about 1:10 to about 1:100 after the gate electrodes 190 are formed.

In some embodiments, a thickness Tc of the channel patterns 131 may be the substantially same as a thickness Ts of the source/drain impurity layers 170, as illustrated in FIG. 14A. In some embodiments, the thickness Tc of the channel patterns 131 may be greater than the thickness Ts of the source/drain impurity layers 170 (See FIG. 31) and may be, for example, 1.1 times the thickness Ts of the source/drain impurity layers 170.

Figure 15:
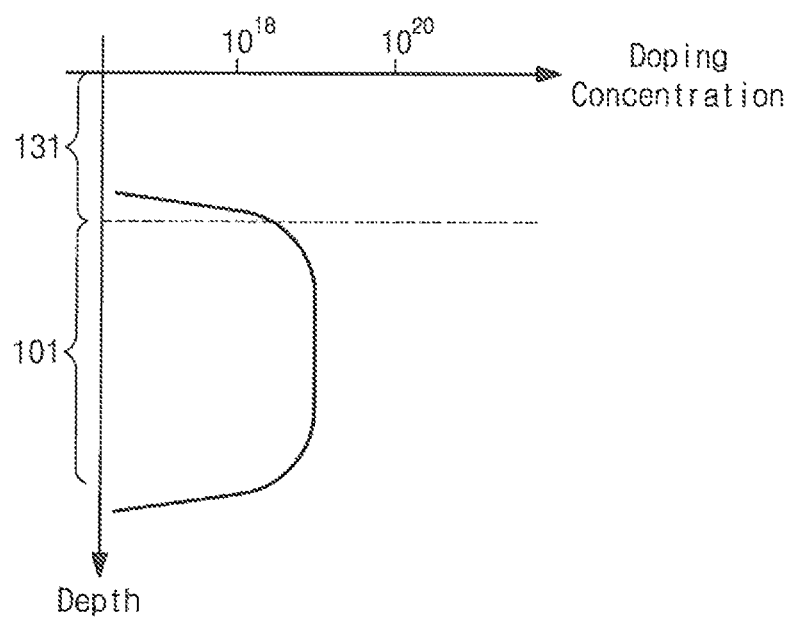
FIG. 15 illustrates a graph showing a dopant concentration profile beneath a gate electrode of a semiconductor device according to example embodiments of the present inventive concepts.

FIG. 15 illustrates a first conductivity-type dopant concentration in the first well impurity layer 310 (i.e., a portion of the semiconductor pattern 101) and the channel patterns 131 of the region A of FIG. 14A.

Referring to FIG. 15, the first conductivity-type (e.g., an n-type conductivity) dopants of the semiconductor pattern 101 may have a substantially uniform concentration along the vertical direction D3. The channel pattern 131 may have a first conductivity-type dopant concentration less than that of the semiconductor pattern 101. A first conductivity-type dopant concentration may markedly decrease at a boundary between the semiconductor pattern 101 and the channel pattern 131, and may be substantially zero in the uppermost portion of the channel pattern 131.

In some embodiments, the dopant concentration of the semiconductor pattern 101 may be within a range of from about 1×10$^{18}$ atoms/cm$^3$ to about 1×10$^{20}$ atoms/cm$^3$. The dopant concentration of the channel pattern 131 may be within a range of from about 1×10$^{16}$ atoms/cm$^3$ to about 1×10$^{20}$ atoms/cm$^3$.

Figure 16:
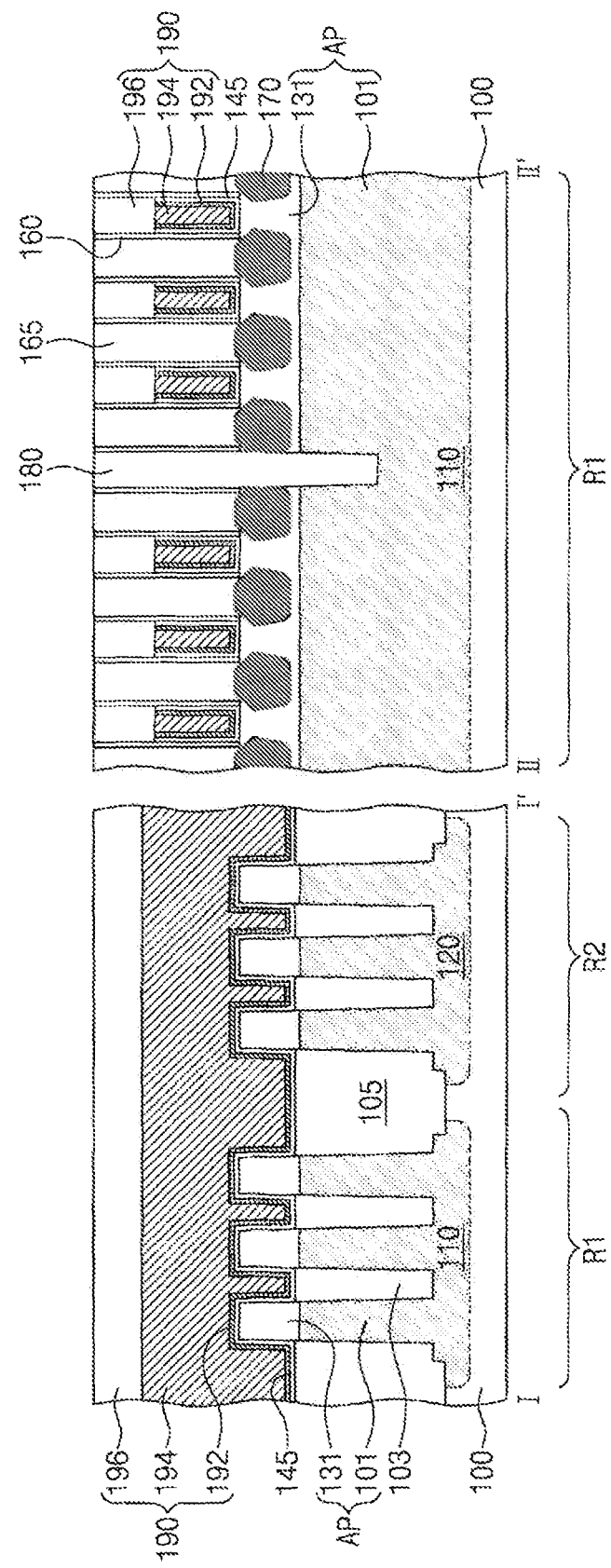
FIGS. 16, 17, and 18 illustrate cross-sectional views taken along the lines I-I' and II-II' of FIG. 3 according to example embodiments of the present inventive concepts.
Figure 17:
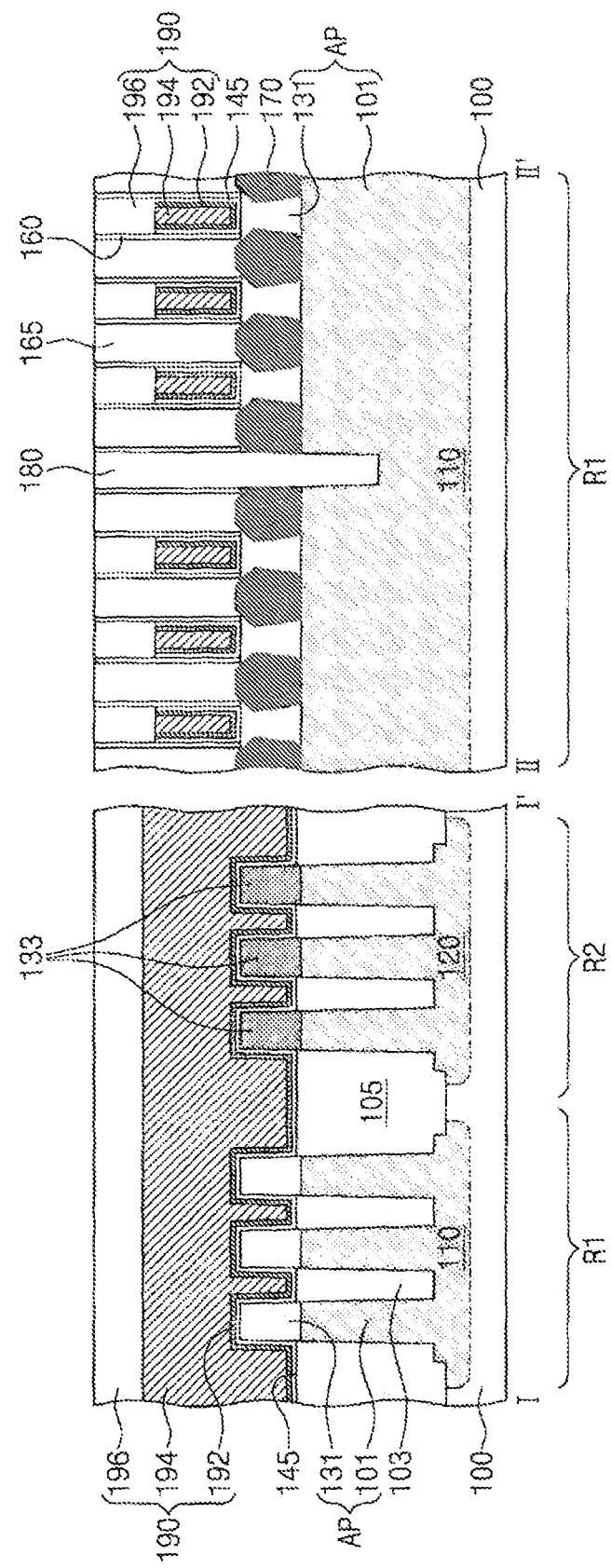
Figure 18:
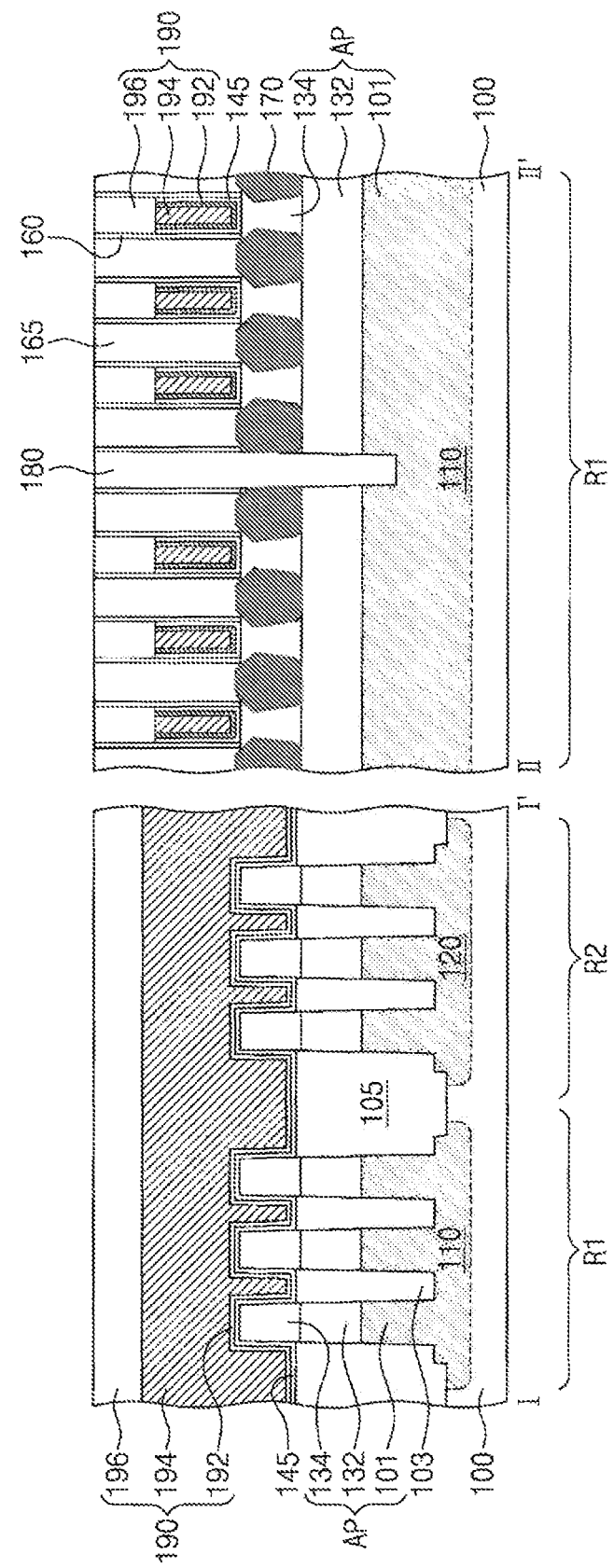

FIGS. 16, 17, and 18 illustrate cross-sectional views taken along the lines I-I' and II-II' of FIG. 3 according to example embodiments of the present inventive concepts. The same technical features as those of the embodiments discussed above with reference to FIGS. 3 to 14 may be omitted for brevity.

According to the embodiment illustrated in FIG. 16, the semiconductor pattern 101 may protrude from the semiconductor substrate 100 to extend in the first direction D1 and may include a first conductivity-type (e.g., an n-type conductivity) dopant in the first region R1 and a second conductivity (e.g., a p-type conductivity) dopant in the second region R2.

The channel patterns 131 may be disposed on corresponding semiconductor patterns 101, and the first device isolation patterns 103 may be disposed between the semiconductor patterns 101 adjacent to each other.

The gate electrodes 190 may be formed to extend in the second direction D2 and to cross the channel patterns 131. The source/drain impurity layers 170 may be disposed on opposite sides of each gate electrode 190. The source/drain impurity layers 170 may be disposed in the channel pattern 131 and may have bottom surfaces spaced apart from the semiconductor pattern 101 into which an n-type or p-type dopant is doped.

According to the embodiment illustrated in FIG. 17, each of the active patterns AP on the first region R1 may include the semiconductor pattern 101 and a first channel pattern 131, and each of the active patterns AP on the second region R2 may include the semiconductor pattern 101 and a second channel pattern 133. The semiconductor pattern 101 on the first region R1 may include a first conductivity-type dopant, and the semiconductor pattern 101 on the second region R2 may include a second conductivity-type dopant.

The first and second channel patterns 131 and 133 may include different semiconductor materials from each other and may have different lattice constants from each other. The first channel pattern 131 may include the same material as that of the semiconductor pattern 101, and the second channel pattern 133 may include a different semiconductor material from that of the semiconductor pattern 101. In some embodiments, the first channel pattern 131 may include a different semiconductor material from that of the semiconductor pattern 101, and the second channel pattern 133 may include the same material as that of the semiconductor pattern 101.

According to the embodiment illustrated in FIG. 18, each of the active patterns AP may include the semiconductor pattern 101 protruding from the semiconductor substrate 100 and may include first and second epitaxial patterns 132 and 134 sequentially stacked on the semiconductor pattern 101. Each of the first and second epitaxial patterns 132 and 134 may be formed using an epitaxial growth process, and the first and second epitaxial patterns 132 and 134 may include semiconductor materials having different lattice constants from each other.

Figure 19:
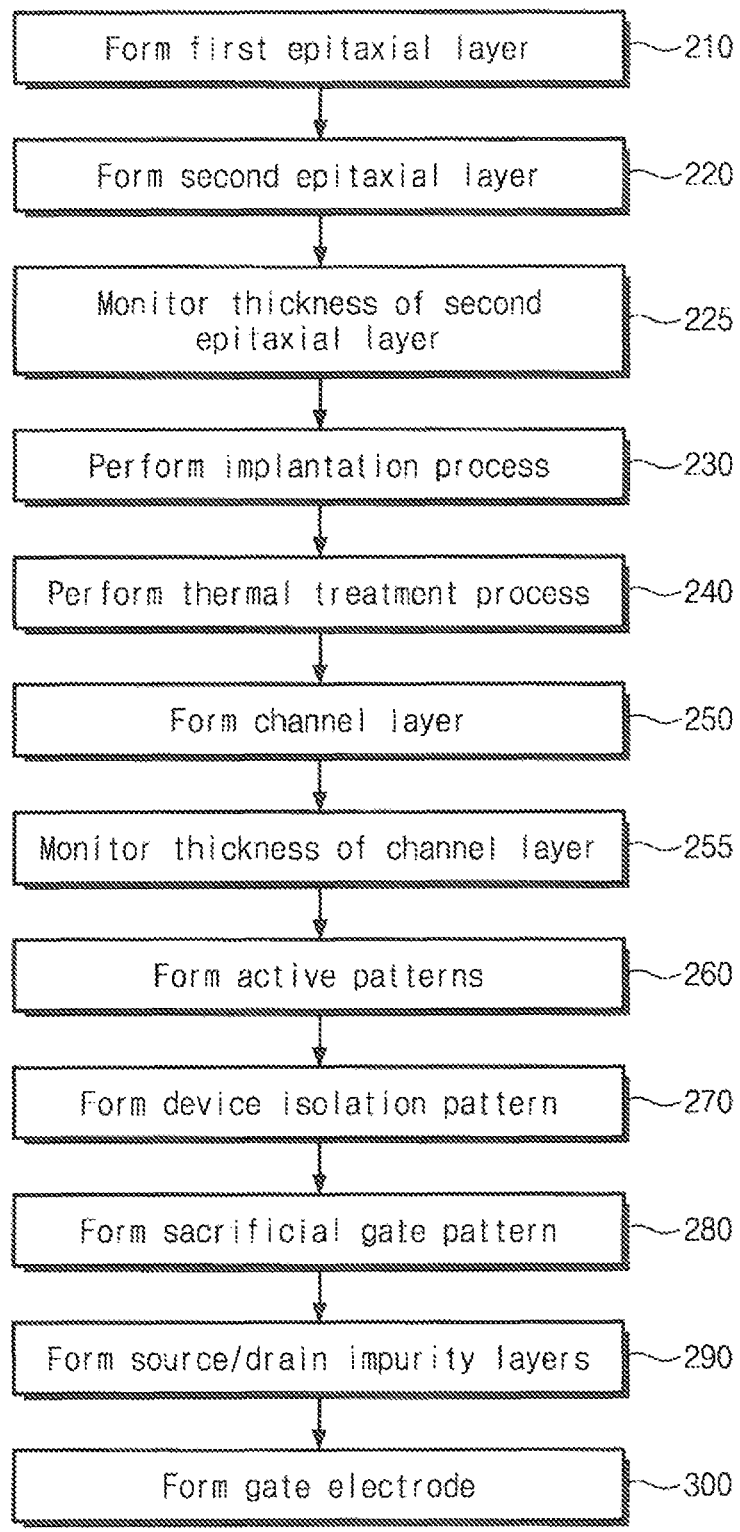
FIG. 19 is a flow chart showing a method of fabricating a semiconductor device according to example embodiments of the present inventive concepts.
Figure 20:
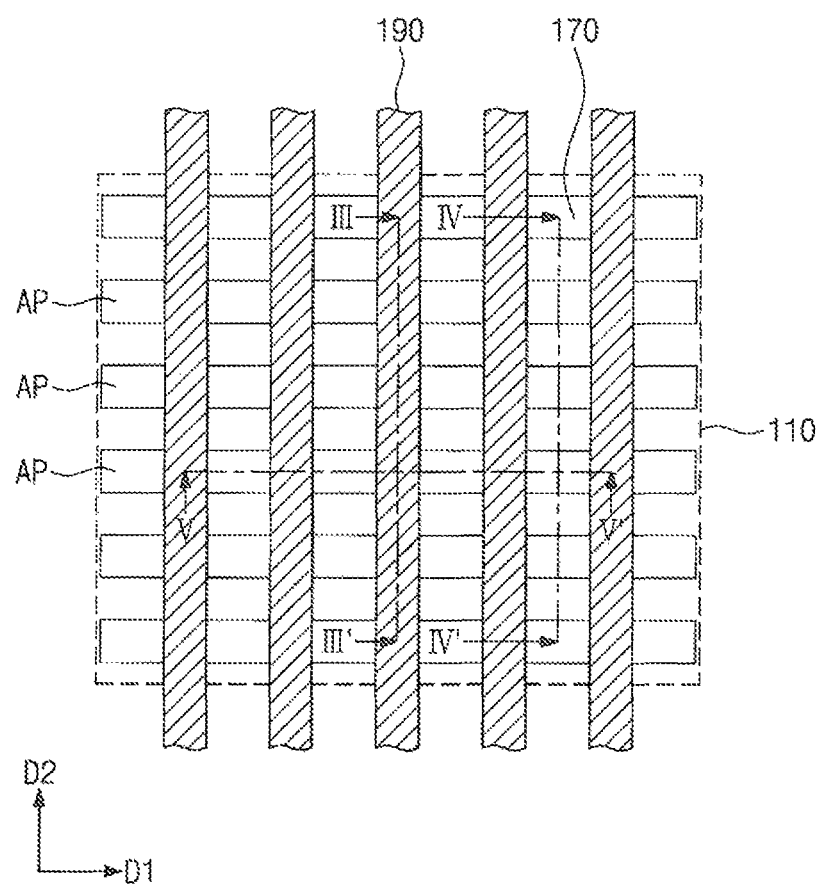
FIG. 20 illustrates a plan view of a semiconductor device according to example embodiments of the present inventive concepts.

FIG. 19 is a flow chart showing a method of fabricating a semiconductor device according to example embodiments of the present inventive concepts. FIG. 20 illustrates a plan view showing a semiconductor device according to example embodiments of the present inventive concepts. FIGS. 21 to 31 illustrate cross-sectional views taken along the lines III-III', IV-IV' and V-V' of FIG. 20 showing a method of fabricating a semiconductor device according to example embodiments of the present inventive concepts. The same technical features discussed above with reference to FIGS. 3 to 14 may be omitted for brevity.

Figure 21:
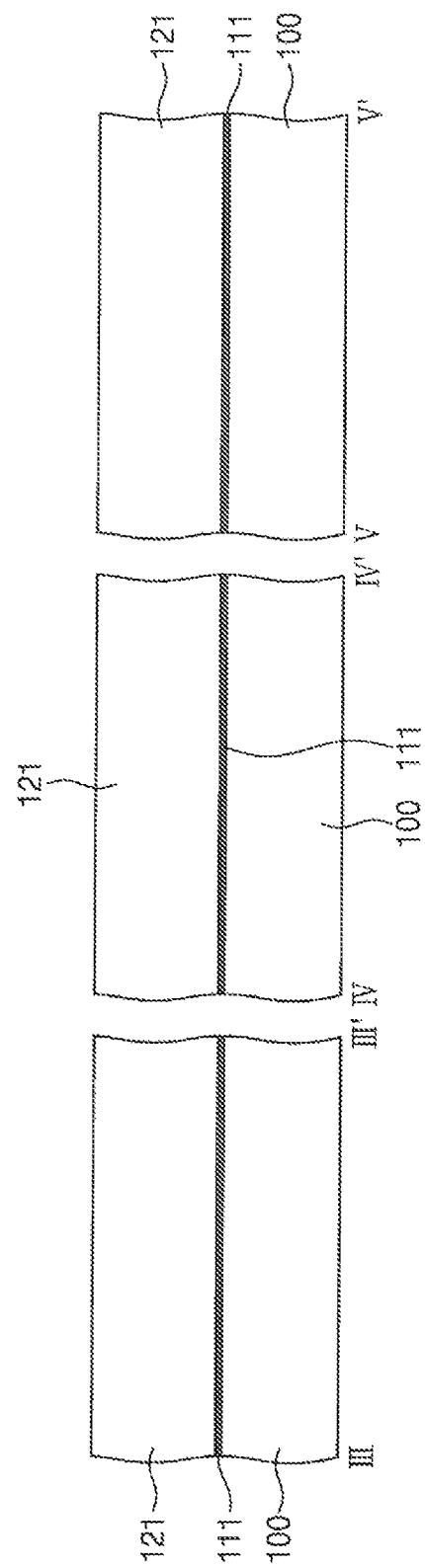
FIGS. 21, 22, 23, 24, 25, 26, 27, 28, 29, 30 and 31 illustrate cross-sectional views taken along the lines III-III' IV-IV', and V-V' of FIG. 20 showing a method of fabricating a semiconductor device according to example embodiments of the present inventive concepts.

Referring to FIGS. 19, 20, and 21, a first epitaxial layer 111 and a second epitaxial layer 121 may be sequentially formed on an entire surface of a semiconductor substrate 100 (Block 210 and Block 220).

For example, the semiconductor substrate 100 may be a bulk silicon substrate doped with an n-type or p-type impurity. As discussed above the semiconductor substrate 100 may include a first region (e.g., R1 of FIG. 3) and a second region (e.g., R2 of FIG. 3).

The first and second epitaxial layers 111 and 121 may be formed by performing an epitaxial growth process in which the semiconductor substrate 100 is used as a seed. The first and second epitaxial layers 111 and 121 may include different semiconductor materials from each other. For example, the first and second epitaxial layers 111 and 121 may have different lattice constants from each other. In some embodiments, the first epitaxial layer 111 may be a silicon carbide (SiC) layer or a silicon germanium (SiGe) layer, and the second epitaxial layer 121 may be a silicon (Si) layer.

The second epitaxial layer 121 may be grown thicker than the first epitaxial layer 111. For example, the first epitaxial layer 111 may have a thickness ranging from about 10 Å to about 100 Å, and the second epitaxial layer 121 may have a thickness ranging from about 1000 Å to about 1500 Å. The first epitaxial layer 111 grown thinner than the second epitaxial layer 121 may be used as a reference layer for monitoring a thickness of the second epitaxial layer 121 and a thickness of a channel layer which will be formed through subsequent processes. In some embodiments, the thickness of the second epitaxial layer 121 may be monitored after the second epitaxial layer 121 is formed. (Block 225). The thickness of the second epitaxial layer 121 may be monitored by measuring a distance between the first epitaxial layer 111 and an upper surface of the second epitaxial layer 121. Since the first epitaxial layer 111 is formed of a material different from the second epitaxial layer 121, an interface between the first epitaxial layer 111 and the second epitaxial layer 121 may be detectable (e.g., visible).

Figure 22:
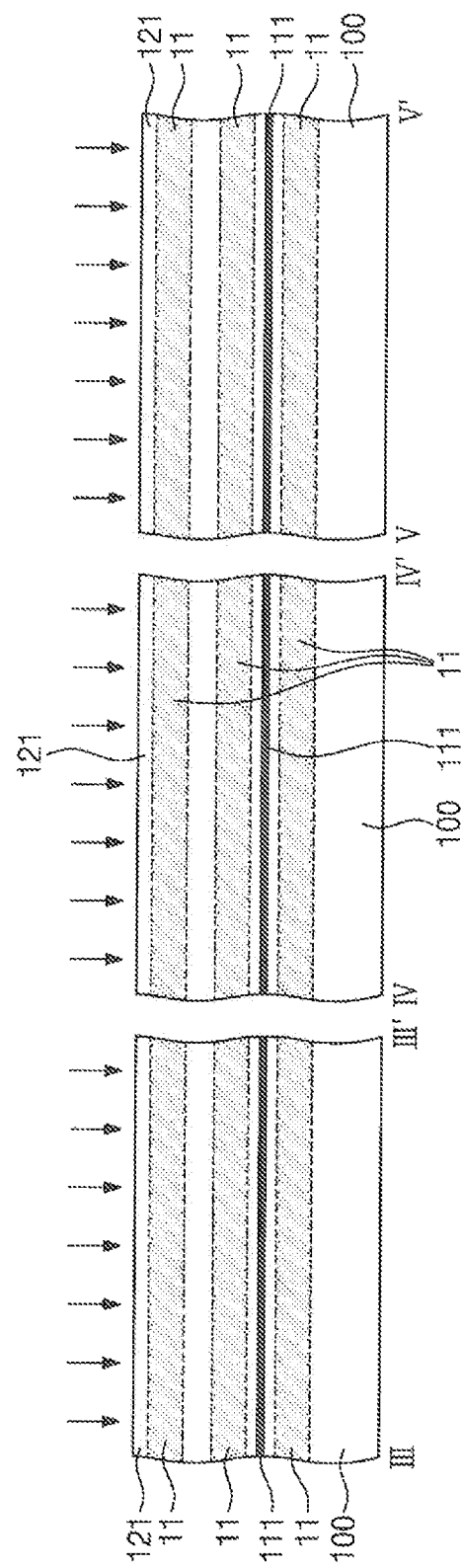

Referring to FIGS. 19, 20, and 22, an ion implantation process may be performed to implant an n-type or p-type dopant into the semiconductor substrate 100 and the first and second epitaxial layers 111 and 121, thereby forming implant regions 11 (Block 230).

As discussed above, when the ion implantation process is performed, the semiconductor substrate 100 and the first and second epitaxial layers 111 and 121 may become amorphous. The implant regions 11 may be formed at different depths in the semiconductor substrate 100 and in the first and second epitaxial layers 111 and 121.

Figure 23:
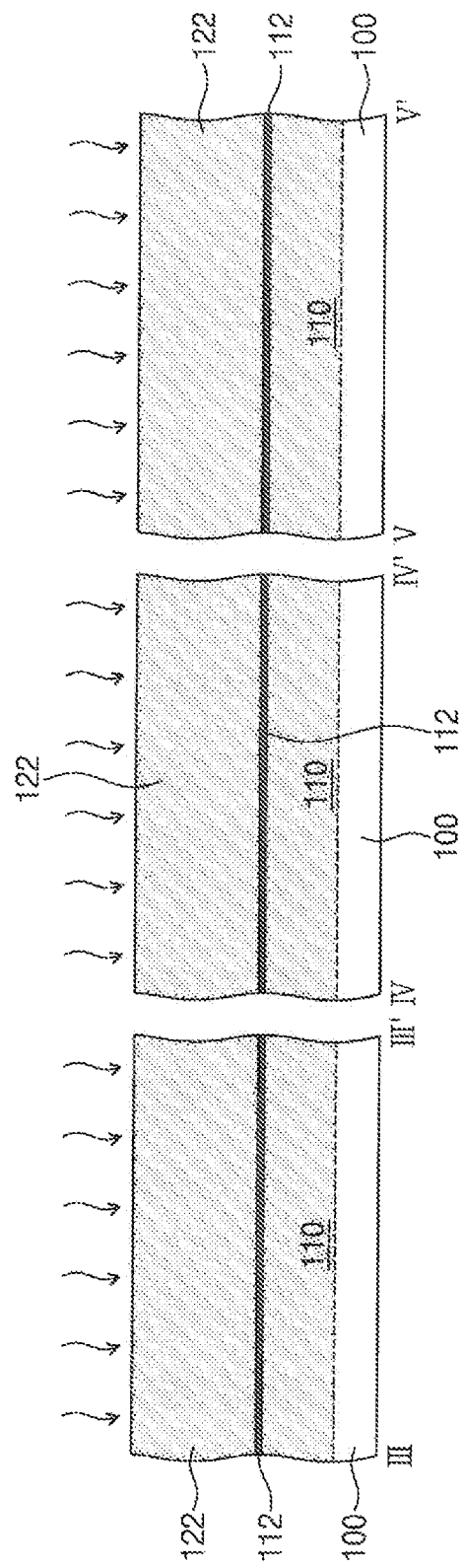

Referring to FIGS. 19, 20, and 23, after the implant regions 11 are formed, a thermal treatment process may be performed to form a well impurity layer 110 (i.e., doped first and second epitaxial layers 112 and 122)(Block 240).

The implant regions 11 may be recrystallized by the thermal treatment process performed on the entire surface of the semiconductor substrate 100, before patterning the semiconductor substrate 100. Therefore, crystal defect formation in the first and second epitaxial layers 112 and 122 may be reduced or possibly prevented. The well impurity layer 110 (i.e., the doped first and second epitaxial layers 112 and 122) may have a substantially uniform dopant concentration after the thermal treatment process.

Figure 24:
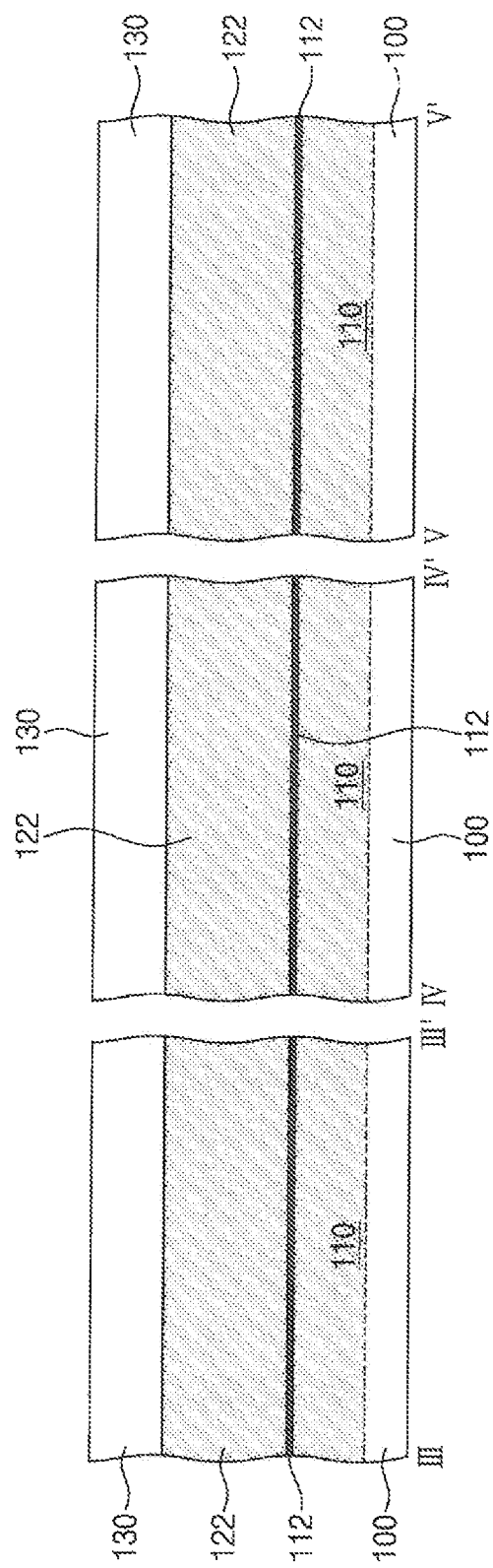

Referring to FIGS. 19, 20, and 24, a channel layer 130 may be formed on the doped second epitaxial layer 122 (Block 250).

The channel layer 130 may be formed using an epitaxial growth process in which the second epitaxial layer 122 is used as a seed. The channel layer 130 may be formed of the same semiconductor material as the second epitaxial layer 122 and may have a thickness ranging from about 300 Å to about 700 Å. As the channel layer 130 is formed on the recrystallized second epitaxial layer 122, which has a lower crystal defect density, crystal defect formation in the channel layer 130 may be reduced or possibly prevented when the channel layer 130 is grown.

When the epitaxial growth process is performed to form the channel layer 130, a thickness of the channel layer 130 may be measured using the first epitaxial layer 111 as a reference layer, and then the epitaxial growth process may be controlled based on the measured thickness. In some embodiments, the thickness of the channel layer 130 may be monitored after the channel layer 130 is formed. (Block 255). The thickness of the channel layer 130 may be monitored by measuring a distance between the first epitaxial layer 111 and an upper surface of the channel layer 130.

Figure 25:
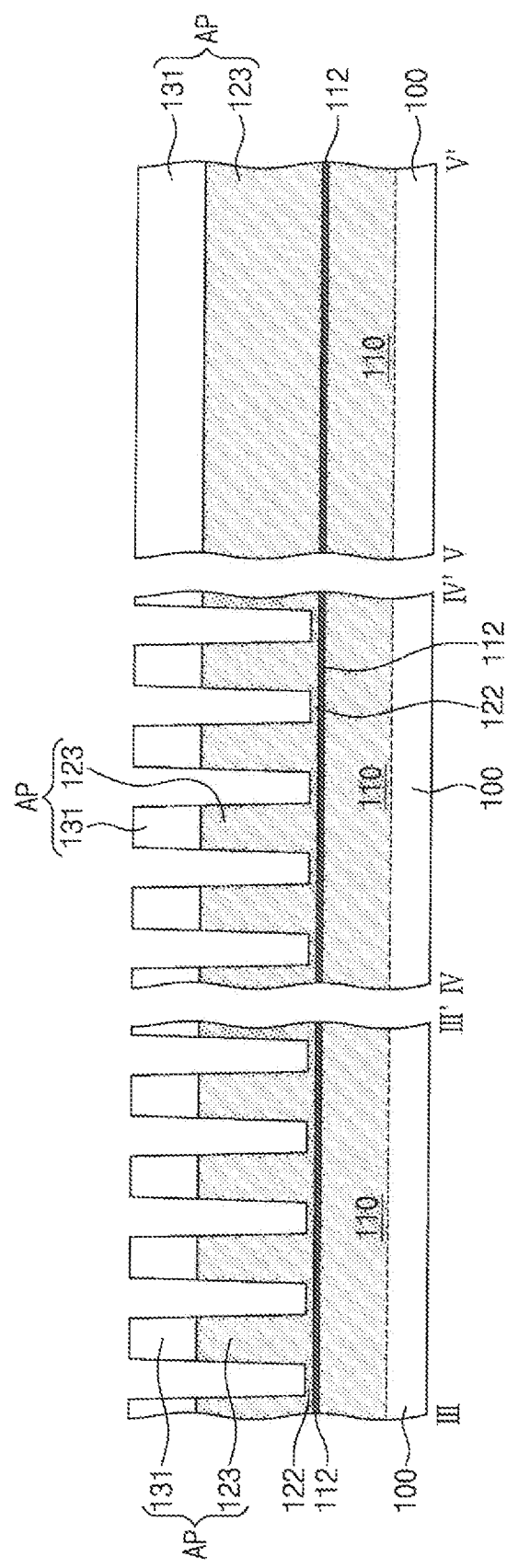

Referring to FIGS. 19, 20, and 25, the channel layer 130 and the second epitaxial layer 122 may be patterned to form active patterns AP (Block 260).

As discussed above with reference to FIG. 8, the active patterns AP may be formed by forming an etch mask pattern and then sequentially etching the channel layer 130 and the second epitaxial layer 122. Device isolation trenches may be formed when the active patterns AP are formed and may have bottom surfaces above the first epitaxial layer 112 as illustrated in FIG. 25.

Each of the active patterns AP may include a second epitaxial pattern 123 corresponding to a portion of the second epitaxial layer 122 and a channel pattern 131 on the second epitaxial pattern 123. The active patterns AP may extend in a first direction D1 and may be spaced apart from each other in a second direction D2.

Figure 26:
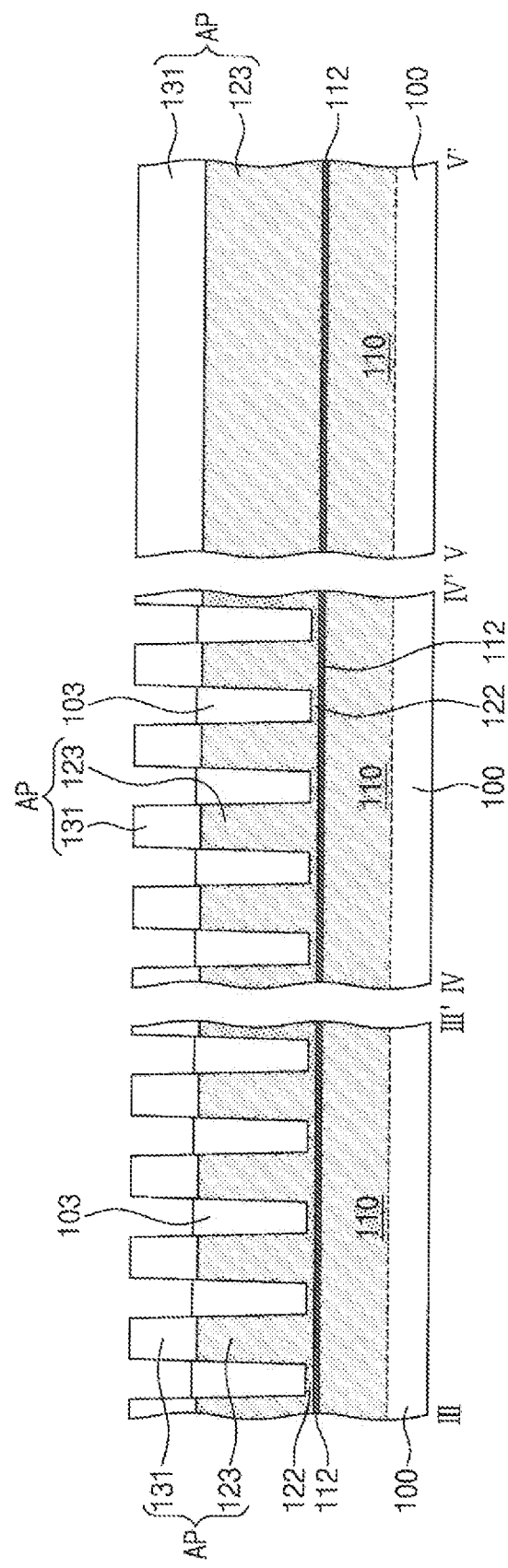

Referring to FIGS. 19, 20, and 26, device isolation patterns 103 may be formed between the active patterns AP (Block 270). The device isolation patterns 103 may fill spaces between the second epitaxial patterns 123 and may have top surfaces lower than those of the channel patterns 131, as illustrated in FIG. 26.

Figure 27:
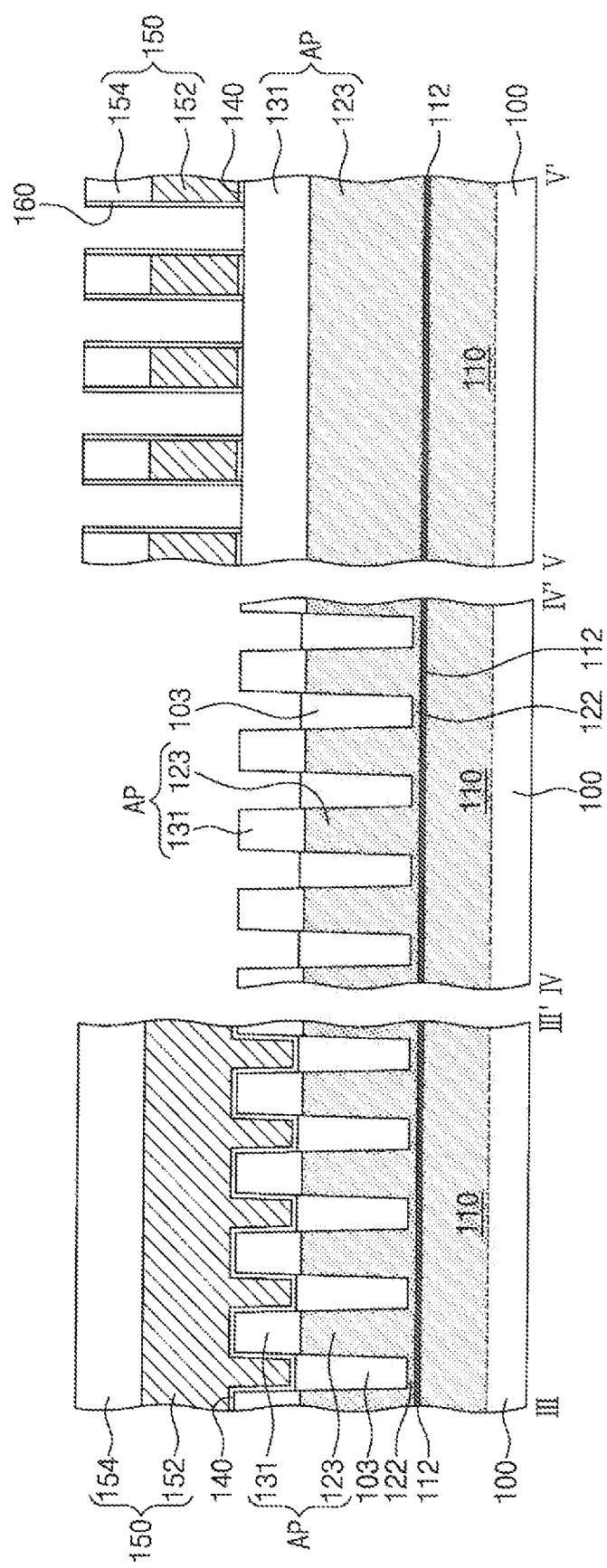

Referring to FIGS. 19, 20, and 27, sacrificial gate patterns 150 may be formed to cross the active patterns AP (Block 280). The formation of the sacrificial gate patterns 150 may be substantially the same as or similar to that discussed above with reference to FIG. 10. For example, each of the sacrificial gate patterns 150 may include a sacrificial pattern 152 and a hardmask pattern 154. In addition, gate spacers 160 may be formed on opposite sidewalls of each of the sacrificial gate patterns 150.

Figure 28:
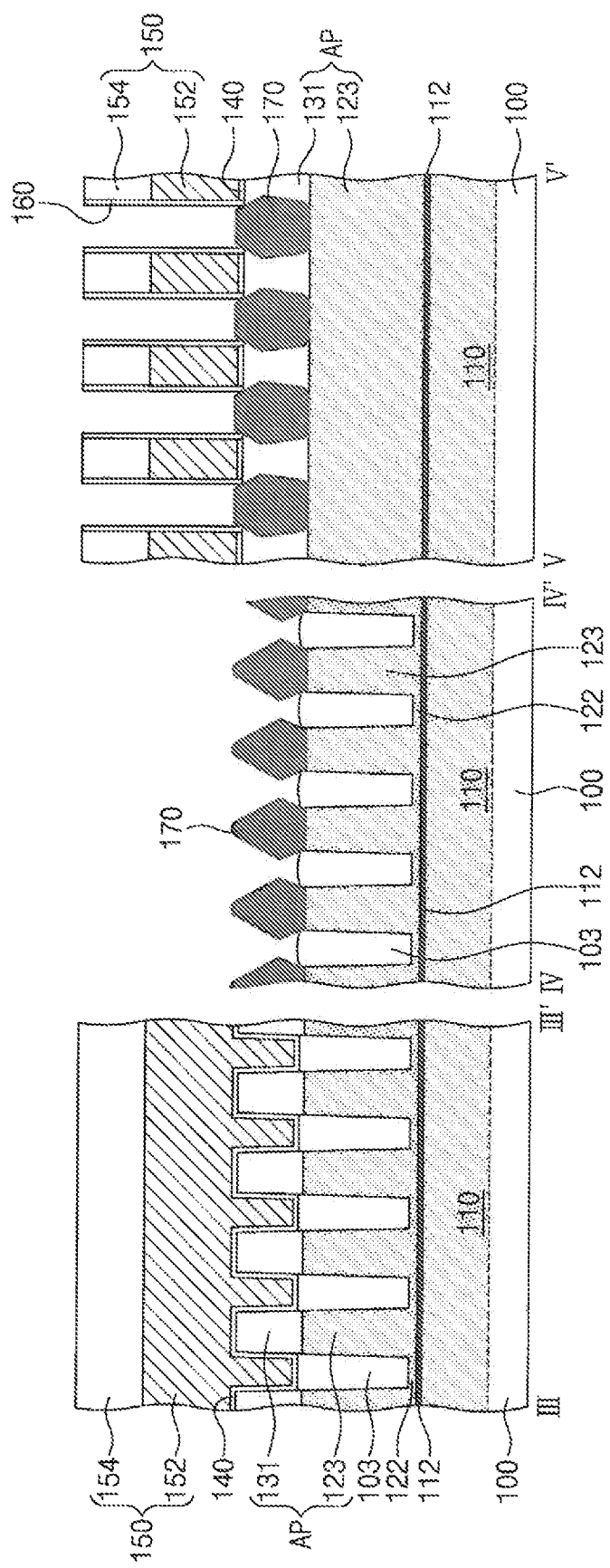

Referring to FIGS. 19, 20, and 28, source/drain impurity layers 170 may be formed in the active patterns AP on opposite sides of each of the sacrificial gate patterns 150 (Block 290).

When the source/drain impurity layers 170 are formed, as discussed above with reference to FIG. 11, the channel patterns 131 may be partially etched on opposite sides of each of the sacrificial gate patterns 150. Accordingly, top surfaces of the second epitaxial patterns 123 may be exposed on the opposite sides of each of the sacrificial gate patterns 150.

Thereafter, the source/drain impurity layers 170 may be epitaxially grown from the top surface of the second epitaxial pattern 123. As discussed above, the source/drain impurity layers 170 may include silicon germanium (SiGe) or silicon carbide (SiC). When the source/drain impurity layers 170 are epitaxially grown, the second/drain impurity layers 170 may be in-situ doped with a dopant whose conductivity is opposite that of a dopant in the second epitaxial pattern 123.

Figure 30:
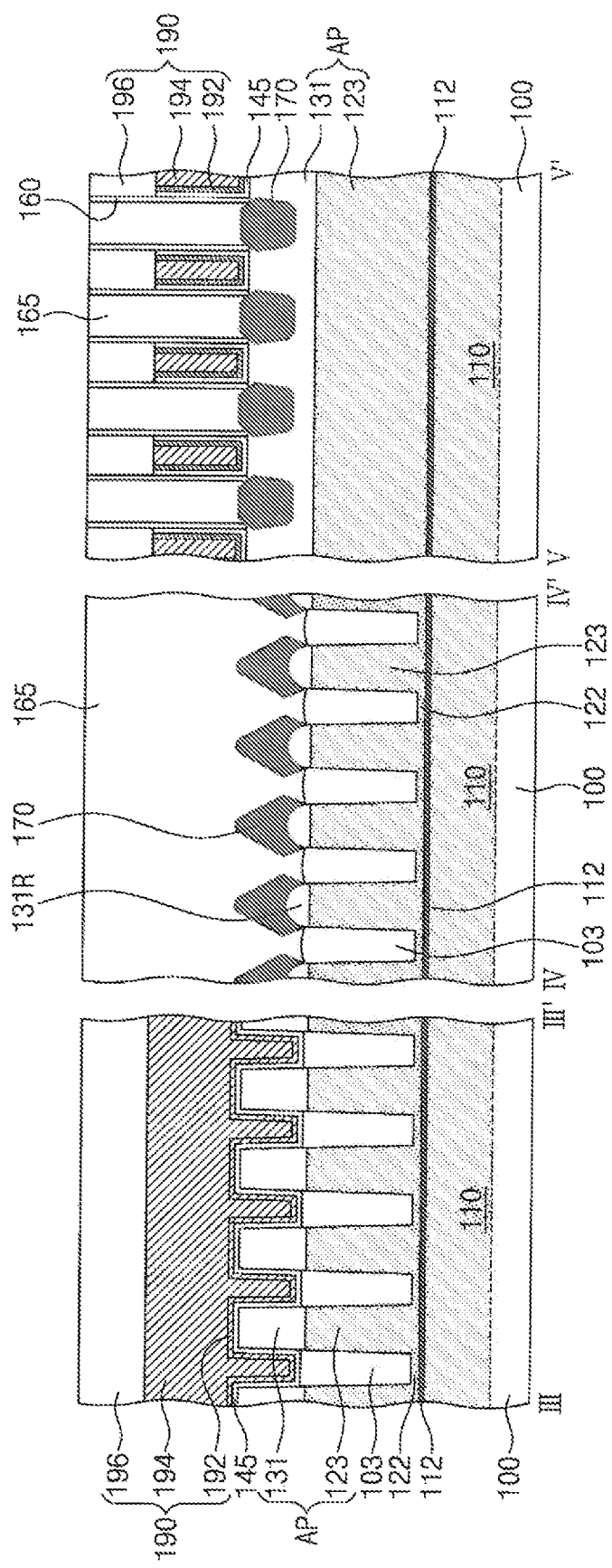

According to some embodiments illustrated in FIG. 30, portions 131R of the channel patterns 131 may remain after recessing the channel patterns 131. In this case, the source/drain impurity layers 170 may be epitaxially grown from the portions 131R of the channel patterns 131. The source/drain impurity layers 170 may have bottom surfaces spaced apart from the second epitaxial pattern 123.

Figure 31:
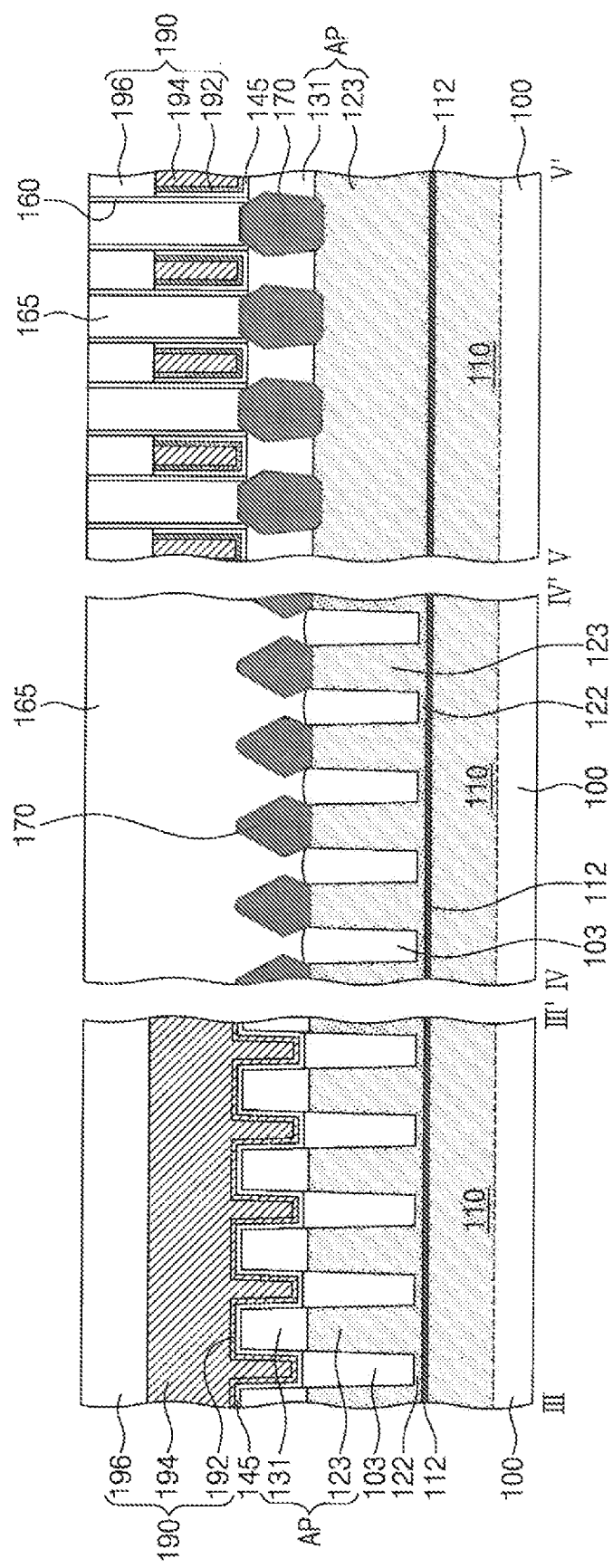

According to some embodiments illustrated in FIG. 31, the channel patterns 131 and the second epitaxial patterns 123 may be partially etched while recessing the channel patterns 131. In this case, the source/drain impurity layers 170 may have bottom surfaces lower than that of the channel pattern 131.

Figure 29:
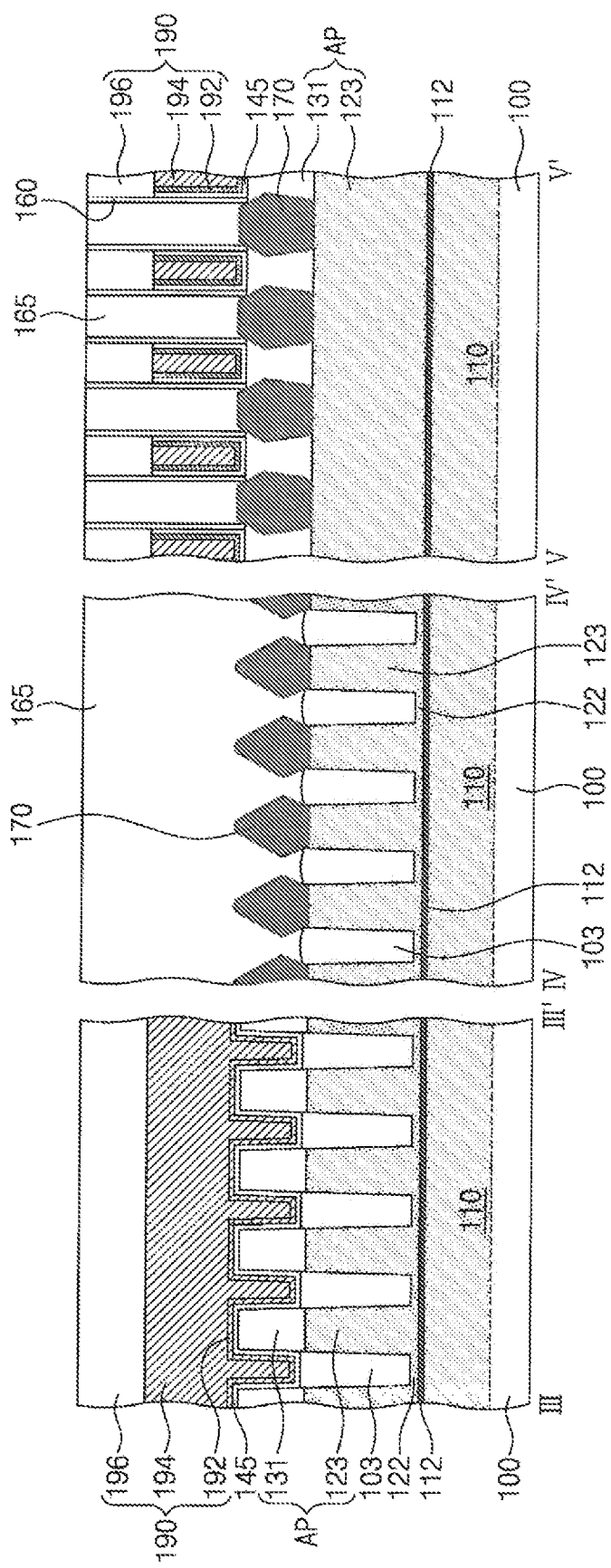

Referring to FIGS. 19, 20, and 29, after the source/drain impurity layers 170 are formed, the sacrificial gate patterns 150 may be replaced with gate electrodes 190 (Block 300). The replacement of the sacrificial gate patterns 150 with the gate electrodes 190 may be substantially the same as or similar to that discussed above with reference to FIGS. 13 and 14.

As appreciated by the present inventors, the semiconductor pattern 101 may have a high crystal defect density if amorphous portions of the semiconductor substrate 100, which are formed while forming well impurity layers, are crystallized after the semiconductor pattern 101 is formed. According to example embodiments of the present inventive concepts, before the semiconductor pattern 101 is formed the well impurity layers may be formed and the amorphous portions of the semiconductor substrate 100 may be crystallized. Accordingly, crystal defect formation may be reduced or possibly prevented.

Furthermore, according to example embodiments of the present inventive concepts, an undoped epitaxial layer serving as a channel layer of a field effect transistor may be formed on semiconductor pattern 101, which may have a lower crystal defect density. Accordingly, a crystal defect density of the undoped epitaxial layer (i.e., channel layer) may be reduced, and a dopant concentration in the channel layer of the field effect transistor may be low. As a result, the field effect transistor may have improved electrical characteristics.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
   sequentially forming a first epitaxial layer and a second epitaxial layer on a substrate, wherein the first epitaxial layer comprises a material different from the second epitaxial layer, and a thickness of the first epitaxial layer is from about 10 Å to about 100 Å;
   implanting dopants into the second epitaxial layer to form a preliminary impurity region in the second epitaxial layer;
   heating the substrate to convert the preliminary impurity region into an impurity region;
   forming a third epitaxial layer on the substrate after heating the substrate;
   forming a first trench and a second trench in the third epitaxial layer and the impurity region to define an active in between the first trench and the second trench;
   forming a first isolation layer and a second isolation layer in the first trench and the second trench, respectively, wherein the active fin protrudes beyond upper surfaces of the first and second isolation layers such that the first and second isolation layers expose opposing sides of the active fin;
   forming a gate insulation layer extending on the opposing sides and an upper surface of the active fin; and
   forming a gate electrode traversing the active fin.

2. The method of claim 1, further comprising measuring a sum of thicknesses of the second and third epitaxial layers by using an upper surface of the first epitaxial layer as a reference line.

3. The method of claim 1, wherein the first epitaxial layer comprises silicon carbide and/or silicon germanium.

4. The method of claim 1, wherein a thickness of the second epitaxial layer is from about 1000 Å to about 1500 Å.

5. The method of claim 1, wherein the impurity region has a crystal defect density lower than a crystal defect density of the preliminary impurity region.

6. The method of claim 1, wherein an upper portion of the active fin comprises an undoped semiconductor pattern that is a portion of an undoped semiconductor layer.

7. The method of claim 1, wherein the preliminary impurity region comprises an amorphous structure, and
   wherein the impurity region comprises a crystalline structure.

8. A method of forming an integrated circuit device, the method comprising
   implanting first dopants into a substrate to form a preliminary impurity region in the substrate, the first dopants having a first conductivity type;
   heating the substrate to convert the preliminary impurity region into an impurity region;
   forming an undoped semiconductor layer on the substrate after heating the substrate;
   forming a first trench and a second trench in the undoped semiconductor layer and the impurity region to define an active fin between the first trench and the second trench;
   forming a first isolation layer and a second isolation layer in the first trench and the second trench, respectively, wherein the active fin protrudes beyond upper surfaces of the first and second isolation layers such that the first and second isolation layers expose opposing sides of the active fin;
   forming a pair of source/drain regions in the undoped semiconductor layer thereby defining a channel region in the undoped semiconductor layer between the pair of source/drain regions, the pair of source/drain regions including second dopants that have a second conductivity type that is opposite the first conductivity type;
   forming a gate insulation layer extending on the opposing sides and an upper surface of the active fin; and
   forming a gate electrode traversing the active fin, wherein the active fin extends longitudinally in a horizontal direction in a plan view, wherein the channel region comprises a middle portion in the horizontal direction, and the middle portion of the channel region comprises some of the second dopants diffused from the pair of source/drain regions, and wherein a concentration of the some of the second dopants in the middle portion of the channel region is about 5E18-5E20 atoms/cm$^3$ after forming the gate electrode.

9. The method of claim 8, wherein a thickness of the channel region in a vertical direction that is substantially perpendicular to the horizontal direction is about 1.1 times a thickness of one of the pair of source/drain regions in the vertical direction.

10. The method of claim 8, wherein heating the substrate is performed at an ambient temperature of from about 850° C. to about 950° C. and for from about 20 min to about 50 min.

11. The method of claim 8, further comprising:
before implanting the first dopants into the substrate, sequentially forming a first epitaxial layer and a second epitaxial layer on a preliminary substrate, wherein the first epitaxial layer comprises a material different from the second epitaxial layer, and wherein the substrate comprises the preliminary substrate, the first epitaxial layer, and the second epitaxial layer; and measuring a sum of thicknesses of the second epitaxial layer and the undoped semiconductor layer by using an upper surface of the first epitaxial layer as a reference line.

12. The method of claim 8, wherein the impurity region has a crystal defect density lower than a crystal defect density of the preliminary impurity region.

13. The method of claim 8, wherein the preliminary impurity region comprises an amorphous structure, and
wherein the impurity region comprises a crystalline structure.

14. A method of forming an integrated circuit device, the method comprising:
sequentially forming a first epitaxial layer and a second epitaxial layer on a substrate;
implanting dopants into the first and second epitaxial layers to form an impurity region;
forming a channel layer on the second epitaxial layer after forming the impurity region;
patterning the channel layer and the second epitaxial layer to form active fins;
forming a gate insulation layer extending on opposing sides and an upper surface of the active fins;
forming a gate electrode traversing the active fins; and
forming a pair of source/drain regions in the active fins on opposite sides of the gate electrode.

15. The method of claim 14, wherein forming the channel layer comprises forming an undoped semiconductor layer by performing an epitaxial growth process using the second epitaxial layer as a seed layer.

16. The method of claim 14, wherein forming the active fins comprises forming trenches in the channel layer and the second epitaxial layer, and
wherein the trenches have bottom surfaces spaced apart from the first epitaxial layer.

17. The method of claim 14, wherein an upper portion of each of the active fins comprises a portion of the second epitaxial layer and a portion of the channel layer.

18. The method of claim 14, wherein a thickness of the first epitaxial layer is less than a thickness of the second epitaxial layer, and
wherein a thickness of the channel layer is less than the thickness of the second epitaxial layer and greater than the thickness of the first epitaxial layer.

19. The method of claim 14, wherein forming the impurity region comprises:
implanting first dopants into the substrate to form a preliminary impurity region in the substrate, the first dopants having a first conductivity type; and
heating the substrate to convert the preliminary impurity region into the impurity region, and
wherein the impurity region has a crystal defect density lower than a crystal defect density of the preliminary impurity region.

20. The method of claim 14, wherein the first epitaxial layer comprises a silicon carbide layer and/or a silicon germanium layer, and
wherein the second epitaxial layer comprises a silicon layer.

* * * * *